US011508746B2

(12) United States Patent
Clampitt et al.

(10) Patent No.: US 11,508,746 B2
(45) Date of Patent: Nov. 22, 2022

(54) SEMICONDUCTOR DEVICE HAVING A STACK OF DATA LINES WITH CONDUCTIVE STRUCTURES ON BOTH SIDES THEREOF

(71) Applicant: Micron Technology, Inc., Boise, ID (US)

(72) Inventors: Darwin A. Clampitt, Wilder, ID (US); Roger W. Lindsay, Boise, ID (US); Christopher R. Ritchie, Boise, ID (US); Shawn D. Lyonsmith, Boise, ID (US); Matthew J. King, Boise, ID (US); Lisa M. Clampitt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 89 days.

(21) Appl. No.: 16/664,280

(22) Filed: Oct. 25, 2019

(65) Prior Publication Data

US 2021/0126007 A1 Apr. 29, 2021

(51) Int. Cl.
*H01L 27/11582* (2017.01)
*H01L 23/528* (2006.01)
(Continued)

(52) U.S. Cl.
CPC .......... *H01L 27/11582* (2013.01); *G11C 7/18* (2013.01); *H01L 21/0217* (2013.01);
(Continued)

(58) Field of Classification Search
CPC ......... H01L 27/11556; H01L 27/11582; H01L 27/11519; H01L 27/11565;
(Continued)

(56) References Cited

U.S. PATENT DOCUMENTS

| 5,453,955 A | 9/1995 | Sakui et al. |
| 6,058,044 A | 5/2000 | Sugiura et al. |

(Continued)

FOREIGN PATENT DOCUMENTS

| CN | 102237368 A | 11/2011 |
| CN | 102623456 A | 8/2012 |

(Continued)

OTHER PUBLICATIONS

"Korean Application Serial No. 10-2015-7013601, Notice of Preliminary Rejection dated Dec. 18, 2019", w/ English Translation, 9 pgs.

(Continued)

*Primary Examiner* — Younes Boulghassoul
(74) *Attorney, Agent, or Firm* — Schwegman Lundberg & Woessner, P.A.

(57) ABSTRACT

Some embodiments include apparatuses and methods of forming the apparatuses. One of the apparatus includes a first conductive contact; a second conductive contact; levels of conductive materials stacked over one another and located over the first and second conductive contacts; levels of dielectric materials interleaved with the levels of the conductive materials, the levels of conductive materials and the levels of dielectric materials formed a stack of materials; a first conductive structure located on a first side of the stack of materials and contacting the first conductive contact and a first level of conductive material of the levels of conductive materials; and a second conductive structure located on a second side of the stack of materials and contacting the second conductive contact and a second level of conductive material of the levels of conductive materials.

10 Claims, 31 Drawing Sheets

(51) Int. Cl.

| | |
|---|---|
| *H01L 23/522* | (2006.01) |
| *H01L 27/11556* | (2017.01) |
| *H01L 27/11565* | (2017.01) |
| *H01L 27/11519* | (2017.01) |
| *H01L 27/11524* | (2017.01) |
| *H01L 27/1157* | (2017.01) |
| *H01L 27/11575* | (2017.01) |
| *H01L 27/11548* | (2017.01) |
| *G11C 7/18* | (2006.01) |
| *H01L 21/768* | (2006.01) |
| *H01L 21/311* | (2006.01) |
| *H01L 21/02* | (2006.01) |

(52) U.S. Cl.
CPC .. *H01L 21/02164* (2013.01); *H01L 21/31111* (2013.01); *H01L 21/31144* (2013.01); *H01L 21/76837* (2013.01); *H01L 21/76885* (2013.01); *H01L 23/528* (2013.01); *H01L 23/5226* (2013.01); *H01L 27/1157* (2013.01); *H01L 27/11519* (2013.01); *H01L 27/11524* (2013.01); *H01L 27/11548* (2013.01); *H01L 27/11556* (2013.01); *H01L 27/11565* (2013.01); *H01L 27/11575* (2013.01)

(58) Field of Classification Search
CPC ......... H01L 27/11575; H01L 27/11548; H01L 27/11573; H01L 27/11526; H01L 27/1157; H01L 27/11524; H01L 23/528; H01L 23/5283; H01L 23/5226; G11C 7/18; H01G 4/232; H01G 4/248
See application file for complete search history.

(56) References Cited

U.S. PATENT DOCUMENTS

| | | | |
|---|---|---|---|
| 6,304,479 | B1 | 10/2001 | Vollrath et al. |
| 6,751,124 | B2 | 6/2004 | Lee |
| 7,243,185 | B2 | 7/2007 | See et al. |
| 7,355,237 | B2 | 4/2008 | Lutze et al. |
| 7,807,533 | B2 | 10/2010 | Lutze et al. |
| 7,978,517 | B2 | 7/2011 | Isobe |
| 8,294,131 | B2 | 10/2012 | Kim et al. |
| 8,368,137 | B2 | 2/2013 | Mokhlesi et al. |
| 8,369,142 | B2 | 2/2013 | Futatsuyama |
| 8,441,855 | B2 | 5/2013 | Liu |
| 8,614,918 | B2 | 12/2013 | Sakui |
| 8,619,471 | B2 | 12/2013 | Tanzawa |
| 8,780,631 | B2 | 7/2014 | Tanzawa |
| 8,811,084 | B2 | 8/2014 | Tanzawa |
| 8,890,233 | B2 | 11/2014 | Hung et al. |
| 8,902,663 | B1 | 12/2014 | Or-Bach et al. |
| 9,036,421 | B2 | 5/2015 | Liu |
| 9,093,152 | B2 | 7/2015 | Sakui et al. |
| 9,147,493 | B2 | 9/2015 | Sakui |
| 9,159,736 | B2 | 10/2015 | Vu et al. |
| 9,711,224 | B2 | 7/2017 | Tanzawa |
| 9,734,915 | B2 | 8/2017 | Sakui |
| 10,242,746 | B2 | 3/2019 | Sakui et al. |
| 10,643,714 | B2 | 5/2020 | Sakui |
| 11,075,163 | B2 | 7/2021 | Sakui et al. |
| 2005/0180186 | A1 | 8/2005 | Lutze et al. |
| 2007/0096254 | A1* | 5/2007 | Ritter .................... H01C 1/148 257/532 |
| 2007/0158736 | A1 | 7/2007 | Arai et al. |
| 2008/0084729 | A1 | 4/2008 | Cho et al. |
| 2008/0157169 | A1 | 7/2008 | Yuan |
| 2008/0160680 | A1 | 7/2008 | Yuan |
| 2009/0067236 | A1 | 3/2009 | Isobe et al. |
| 2009/0238005 | A1 | 9/2009 | You |
| 2009/0251962 | A1 | 10/2009 | Yun et al. |
| 2009/0268523 | A1 | 10/2009 | Maejima |
| 2010/0036600 | A1 | 2/2010 | Shinmyoh et al. |
| 2010/0322000 | A1 | 12/2010 | Shim et al. |
| 2011/0002178 | A1 | 1/2011 | Hwang et al. |
| 2011/0013458 | A1 | 1/2011 | Seol |
| 2011/0266604 | A1 | 11/2011 | Kim et al. |
| 2011/0299314 | A1 | 12/2011 | Samachisa et al. |
| 2011/0310673 | A1 | 12/2011 | Cho et al. |
| 2012/0001249 | A1 | 1/2012 | Alsmeier et al. |
| 2012/0044733 | A1 | 2/2012 | Scheuerlein |
| 2012/0063231 | A1 | 3/2012 | Wood et al. |
| 2012/0081958 | A1 | 4/2012 | Lee et al. |
| 2012/0140549 | A1 | 6/2012 | Maejima |
| 2012/0257433 | A1 | 10/2012 | Yan et al. |
| 2014/0119117 | A1* | 5/2014 | Sakui .................. G11C 11/5671 365/185.05 |
| 2014/0369116 | A1* | 12/2014 | Sakui ................. G11C 16/0483 365/185.02 |
| 2015/0162084 | A1* | 6/2015 | Morooka ............ G11C 16/3427 365/185.11 |
| 2015/0333001 | A1 | 11/2015 | Sakui et al. |
| 2016/0019970 | A1 | 1/2016 | Sakui |
| 2017/0365615 | A1 | 12/2017 | Dennison et al. |
| 2018/0068794 | A1* | 3/2018 | Lee .......................... H01G 4/30 |
| 2018/0122482 | A1 | 5/2018 | Sakui |
| 2018/0295715 | A1* | 10/2018 | Tsukuda ................... H05K 1/11 |
| 2019/0237475 | A1* | 8/2019 | Jung ................. H01L 27/11573 |
| 2019/0279722 | A1 | 9/2019 | Sakui |
| 2021/0193570 | A1* | 6/2021 | Moschiano ....... H01L 27/11582 |

FOREIGN PATENT DOCUMENTS

| | | |
|---|---|---|
| CN | 104813406 A | 7/2015 |
| CN | 104813406 B | 4/2020 |
| CN | 111402941 A | 7/2020 |
| CN | 112713148 A | 4/2021 |
| CN | 113012740 A | 6/2021 |
| KR | 20110132820 A | 12/2011 |
| KR | 101102548 B1 | 1/2012 |
| KR | 20120013971 A | 2/2012 |
| KR | 20120084268 A | 7/2012 |
| KR | 20120122673 A | 11/2012 |
| TW | 201432693 A | 8/2014 |
| TW | I735404 B | 8/2021 |
| WO | WO-2014066837 A1 | 5/2014 |

OTHER PUBLICATIONS

"Taiwanese Application Serial No. 102138789, First Office Action dated Feb. 14, 2020", w/ English tranlsation, 32 pgs.
"A 34 MB/SMLC Write Throughput 16 GB NAND With All BitLine Architecture on 56 nm Technology", IEEE Journal of Solid-State Circuits, 44(1), (Jan. 2009), 186-193.
"Chinese Application Serial No. 201380062063.3, Office Action dated May 13, 2019", w/ English translation, 21 pgs.
"Chinese Application Serial No. 201380062063.3, Office Action dated Jun. 22, 2018", w/ English translation, 21 pgs.
"Chinese Application Serial No. 201380062063.3, Response filed Jul. 26, 2019 to Office Action dated May 13, 2019", w/ English Claims, 34 pgs.
"Chinese Application Serial No. 201380062063.3, Response filed Nov. 7, 2018 to Office Action dated Jun. 22, 2018", w/ English Claims, 24 pgs.
"International Application Serial No. PCT/US2013/066941, International Preliminary Report on Patentability dated May 7, 2015", 9 pgs.
"International Application Serial No. PCT/US2013/066941, International Search Report dated Feb. 10, 2014", 3 pgs.
"International Application Serial No. PCT/US2013/066941, Written Opinion dated Feb. 10, 2014", 7 pgs.
"Taiwanese Application Serial No. 102138789, Decision of Rejection dated Oct. 12, 2018", w/ English translation, 11 pgs.
"Taiwanese Application Serial No. 102138789, Office Action dated Jul. 11, 2017", No English Translation, 12 pgs.
"Taiwanese Application Serial No. 102138789, Office Action dated Nov. 22, 2017", With English Translation, 31 pgs.

(56) References Cited

OTHER PUBLICATIONS

"Taiwanese Application Serial No. 102138789, Response filed Feb. 22, 2018 to Office Action dated Nov. 22, 2017", w/English Claims, 15 pgs.

"Taiwanese Application Serial No. 102138789, Response filed Apr. 16, 2019 to Decision of Rejection dated Oct. 12, 2018", w/ English Claims, 16 pgs.

"Taiwanese Application Serial No. 102138789, Response Filed Oct. 12, 2017 to Office Action dated Jul. 11, 2017", w/English Claims, 13 pgs.

Nakano, H, et al., "A dual layer bitline DRAM array with Vcc/Vss hybrid precharge for multi-gigabitDRAMS", Symposium on VLSI Circuits, Digest of Technical Papers., (Jun. 1996).

"Taiwanese Application Serial No. 102138789, Office Action dated Sep. 22, 2020", w/ English Translation of Search Report, 13 pgs.

"Taiwanese Application Serial No. 102138789, Response filed Jun. 22, 2020 to First Office Action dated Feb. 14, 2020", w/ English Claims, 18 pgs.

U.S. Appl. No. 16/723,758, filed Dec. 20, 2019, Memory Device Including Data Lines on Multiple Device Levels.

"Korean Application Serial No. 10-2015-7013601, Notice of Preliminary Rejection dated Dec. 29, 2020", w/ English translation, 11 pgs.

"Korean Application Serial No. 10-2015-7013601, Response filed Mar. 2, 2021 to Notice of Preliminary Rejection dated Dec. 29, 2020", w/ English Claims, 15 pgs.

"Taiwanese Application Serial No. 102138789, Response filed Mar. 25, 2021 to Office Action dated Sep. 22, 2020", w/ English Claims, 17 pgs.

"Korean Application Serial No. 10-2015-7013601, Final Office Action dated Jul. 29, 2021", w/ English translation, 7 pgs.

\* cited by examiner

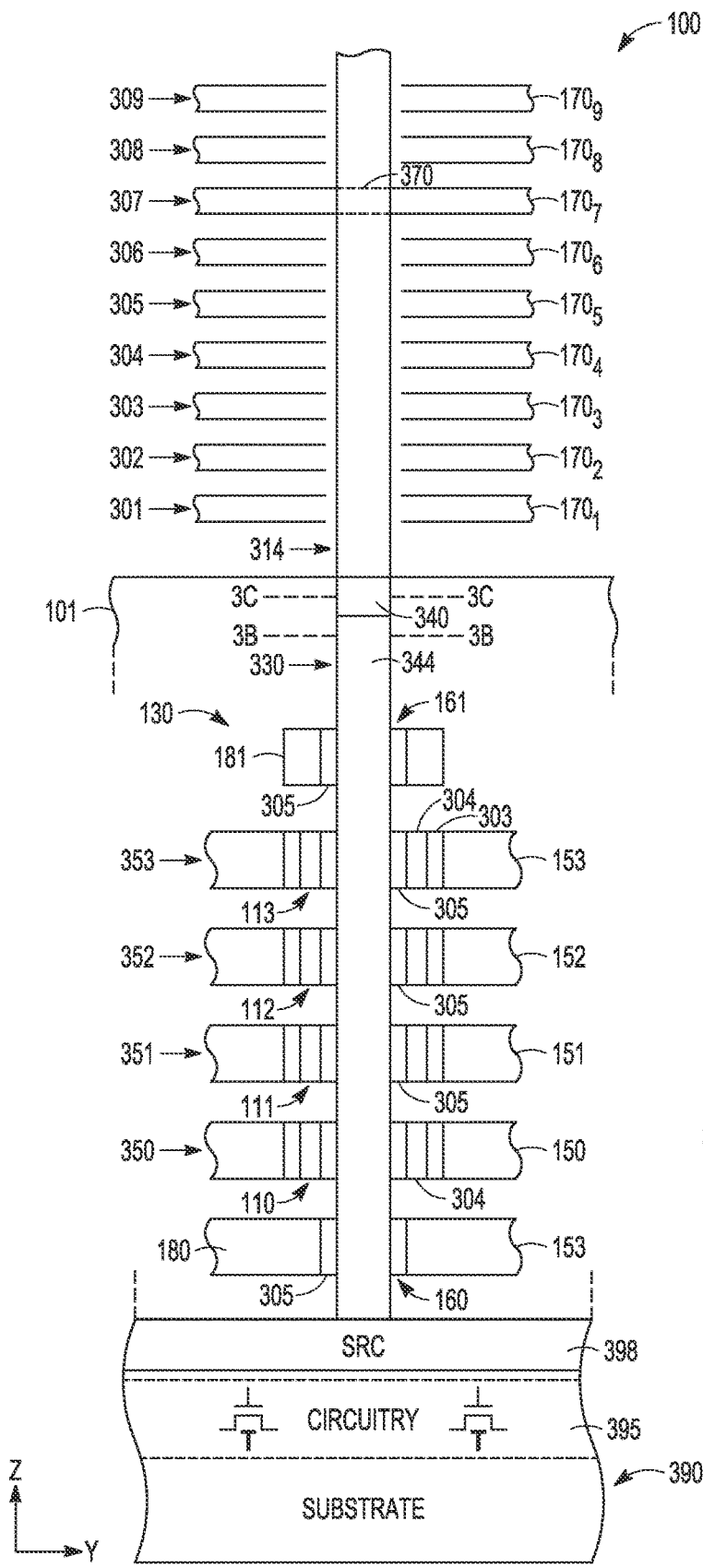
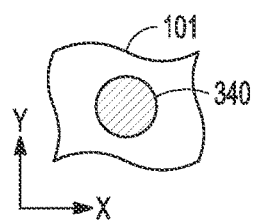
FIG. 3C
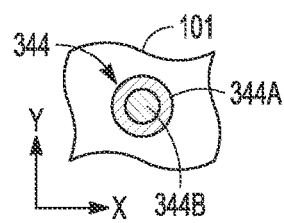
FIG. 3B
FIG. 3A

SEMICONDUCTOR DEVICE HAVING A STACK OF DATA LINES WITH CONDUCTIVE STRUCTURES ON BOTH SIDES THEREOF

BACKGROUND

Semiconductor devices such as memory devices are widely used in computers and many other electronic items to store information. A memory device often includes a memory cells and data lines to carry information (in the form of signals) to and from the memory cells. As demand for memory cell density for a given device area increases, the number of data lines may also increase to keep pace with the increased memory cell density. However, because area limitation in some conventional memory devices, increasing the number of data lines in such conventional memory devices may pose a challenge.

BRIEF DESCRIPTION OF THE DRAWINGS

FIG. 3A shows a side view (e.g., a cross section with respect to the Z-Y directions) of a structure of a portion of the memory device of FIG. 2 including the structure of a set of data lines and a structure of a memory cell string of the memory device of FIG. 2, according to some embodiments described herein.

FIG. 3B shows a top view (e.g., a cross section respect to the X-Y plan) of a portion of a pillar of a memory cell string of FIG. 3A, according to some embodiments described herein.

FIG. 3C shows a top view (e.g., a cross section respect to the X-Y plan) of a conductive contact of a pillar of a memory cell string of FIG. 3A, according to some embodiments described herein.

DETAILED DESCRIPTION

The techniques described herein a memory device having stacked data lines where the data lines are stacked over one another in different levels (vertical levels) of the memory device. The stacked structure of the data lines described herein can increase the density of the data lines for a given area. This can allow more memory cells to be coupled to the data lines. This can increase memory cell density for a given area of the described memory device. Other improvements and benefits of the described techniques are discussed below with reference to FIG. 1 through FIG. 31.

Figure 1:
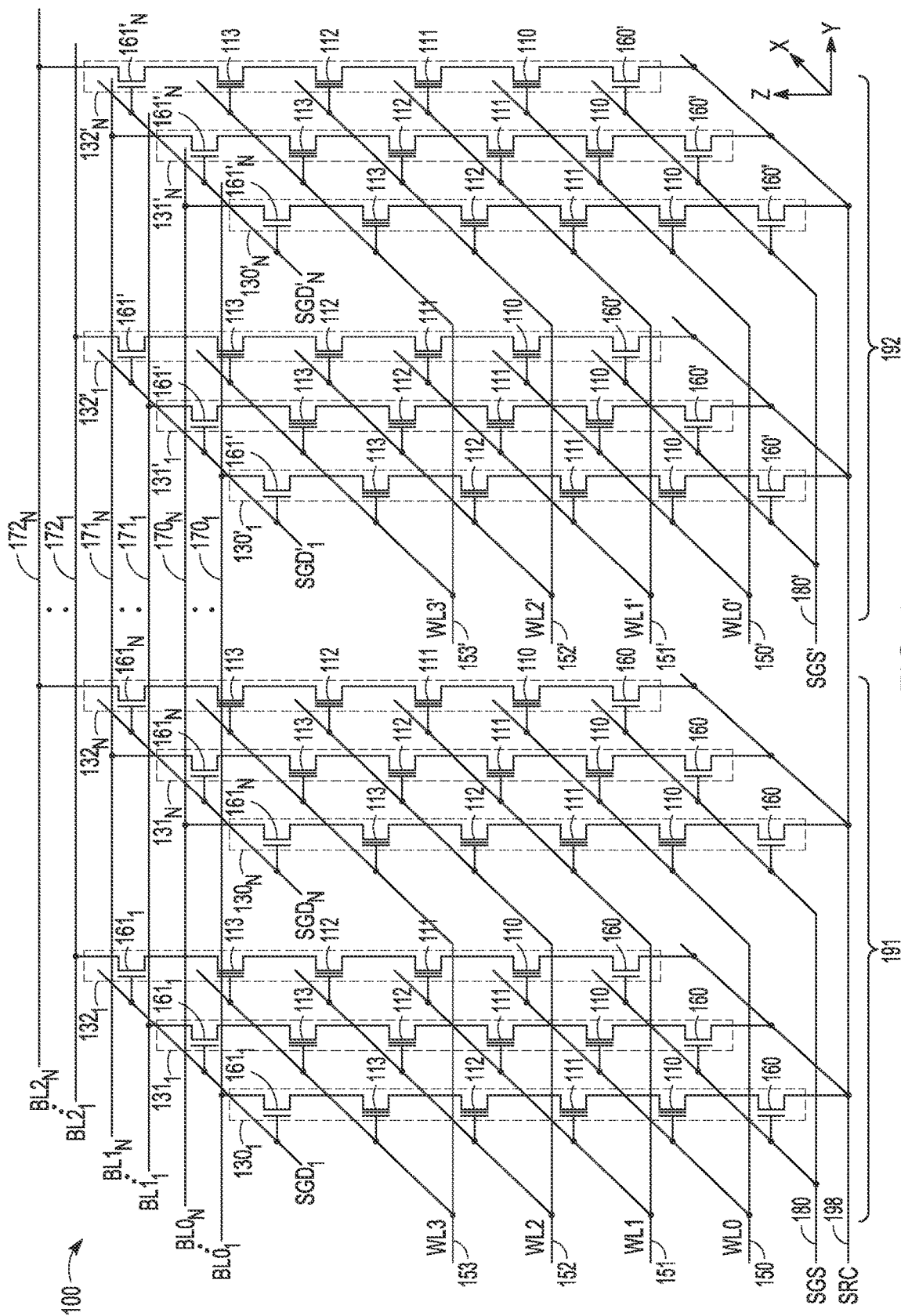
FIG. 1 shows a portion of a schematic diagram of an apparatus in the form a memory device having sets of data lines, according to an embodiment of the invention.

FIG. 1 shows a portion of a schematic diagram of an apparatus in the form a memory device 100 having sets of data lines, according to an embodiment of the invention. Memory device 100 can include a non-volatile (e.g., NAND flash memory device) or other types of memory devices. As shown in FIG. 1, memory device 100 can include a memory cell area (e.g., memory array area) 101 (which has memory cells 110, 111, 112, and 113) and data lines (a set of data lines) $170_1$ through $170_N$, data lines (a set of data lines) $171_1$ through $171_N$, and data lines (a set of data lines) $172_1$ through $172_N$. Data lines $170_1$ through $170_9$, $171_1$ through $171_9$, and $172_1$ through $172_9$ can include (or can be part of) bit lines (e.g., local bit lines) of memory device 100.

Memory device 100 can include an equal number of data lines among the sets (e.g., the stacks) of the data lines. In FIG. 1, label "N" (the number of data lines in each set of data lines) can be any integer at least equal to two (N can be equal to two (N=2) or N can be greater than two (N>2)).

As shown in FIG. 1, data lines $170_1$ through $170_N$ can carry signals (e.g., bit line signals) $BL0_1$ through $BL0_N$, respectively. Data lines $171_1$ through $171_N$ can carry signals (e.g., bit line signals) $BL1_1$ through $BL1_N$, respectively. Data lines $172_1$ through $172_N$ can carry signals (e.g., bit line signals) $BL2_1$ through $BL2_N$, respectively.

FIG. 1 shows directions X, Y, and Z that can be relative to the physical directions (e.g., dimensions) of the structure of memory device 100. For example, the Z-direction can be a direction perpendicular to (e.g., vertical direction relative to) a substrate (e.g., a semiconductor substrate) of memory device 100. The Z-direction is perpendicular to the X-direction and Y-direction (e.g., the Z-direction is perpendicular to an X-Y plane of memory device 100).

In the physical structure of memory device 100, data lines $170_1$ through $170_N$, data lines $171_1$ through $171_N$, and data lines $172_1$ through $172_N$ can be structured as conductive lines and have respective lengths extending in the Y-direction. As described in more detail below, the data lines (e.g., data lines $170_1$ through $170_N$) within the same set of data lines (e.g., data lines $170_1$ through $170_N$) can be formed in a stack structure. In the stack structure, the data lines within the same set can be located (e.g., stacked) one over another in different levels (e.g., layers) in the Z-direction over memory cell area 101 of memory device 100. For example, in a physical structure of memory device 100, data lines $170_1$ through $170_N$, data lines $171_1$ through $171_N$, and data lines $172_1$ through $172_N$ can be formed in respective stacks (e.g., side-by-side stacks in the X-direction) over memory cell area 101. For example, data lines $170_1$ through $170_N$ can be formed in a stack (e.g., first stack of data lines), data lines $171_1$ through $171_N$ can be formed in another stack (e.g., a second stack of data lines next to the first stack), and data lines $172_1$ through $172_N$ stack (e.g., a third stack of data lines next to the second stack).

FIG. 1 shows memory device 100 including an example of three sets of data lines (e.g., the set of data lines $170_1$ through $170_9$, the set of data lines $171_1$ through $171_9$, and the set of data lines $172_1$ through $172_9$). However, memory device 100 can include numerous of sets of data lines.

As shown in FIG. 1, memory cells 110, 111, 112, and 113 can be organized into blocks (blocks of memory cells). FIG. 1 shows memory device 100 including two blocks 191 and 192 as an example. However, memory device 100 can include numerous blocks. The blocks (e.g., blocks 191 and 192) of memory device 100 can share data lines (e.g., data lines $170_1$ through $170_9$, $171_1$ through $171_9$, and $172_1$ through $172_9$) to carry information (in the form of signals) read from or to be stored in memory cells of selected memory cells (e.g., selected memory cells in block 191 or 192) of memory device 100.

As shown in FIG. 1, memory cells 110, 111, 112, and 113 can be included in (e.g., can be formed as) respective memory cell strings in each of the blocks (e.g., blocks 191 and 192) of memory device 100. For example, in block 191, memory device 100 can include memory cell strings $130_1$ through $130_N$, memory cell strings $131_1$ through $131_N$, and memory cell strings $132_1$ through $132_N$. In another example, in block 192, memory device 100 can include memory cell strings $130'_1$ through $130'_N$, memory cell strings $131'_1$ through $131'_N$, and memory cell strings $132'_1$ through $132'_N$.

In each block (e.g., block 191 or 192) of memory device 100, the number of memory strings in the X-direction that are coupled to a set of data lines can be equal to the number (e.g., N) of data lines of the set of data lines.

As shown in FIG. 1, each memory cell string (e.g., memory cell string $130_1$) of memory device 100 can have series-connected memory cells (e.g., four series-connected memory cells) where series-connected memory cells can include one of memory cells 110, one of memory cells 111, one of memory cells 112, and one of memory cells 113. In a physical structure of memory device 100, memory cells 110, 111, 112, and 113 can be formed (e.g., formed vertically) in different levels (e.g., four different layers) in the Z-direction of memory device 100 and under the stack structures of data lines $170_1$ through $170_9$, $171_1$ through $171_9$, and $172_1$ through $172_9$). FIG. 1 shows an example of four memory cells in each memory cell strings (e.g., memory cells 110, 111, 112 and 113 in memory cell string $130_1$). However, the number of memory cells in each memory cell string of memory device 100 can vary.

As shown in FIG. 1, memory device 100 can include control gates 150, 151, 152, and 153 that can carry corresponding signals WL0, WL1, WL2, and WL3. Control gates 150, 151, 152, and 153 can include (or can be parts of) access lines (e.g., word lines) of memory device 100. Each of control gates 150, 151, 152, and 153 can be part of a structure (e.g., a level) of a conductive material (e.g., a layer of conductive material) located in a single level of memory device 100. Memory device 100 can use signals WL0, WL1, WL2, and WL3 to control access to memory cells 110, 111, 112, and 113, respectively, of block 191 during an operation (e.g., read, write, or erase operation). For example, during a read operation, memory device 100 can use signals WL0, WL1, WL2, and WL3 to control access to memory cells 110, 111, 112, and 113 of block 191 to read (e.g., sense) information (e.g., previously stored information) from memory cells 110, 111, 112, and 113 of block 191. In another example, during a write operation, memory device 100 can use signals WL0, WL1, WL2, and WL3 to control access to memory cells 110, 111, 112, and 113 of block 191 to store information in memory cells 110, 111, 112, and 113 block 191.

Memory device 100 can include similar control gates in block 192. For example, memory device can include control gates 150', 151', 152', and 153' that can carry corresponding signals WL0', WL1', WL2', and WL3'. Each of control gates 150', 151', 152', and 153' can be part of a structure (e.g., a level) of a conductive material (e.g., a layer of conductive material) located in a single level of memory device 100. Control gates 150', 151', 152', and 153' can be located in the same levels as control gates 150, 151, 152, and 153, respectively. As shown in FIG. 1, control gates 150', 151', 152', and 153' can be electrically separated from control gates 150, 151, 152, and 153. Thus, the access lines that include control gates 150, 151, 152, and 153 can be electrically separated from the access lines that include control gates control gates 150', 151', 152', and 153'.

Memory device 100 can use signals WL0', WL1', WL2', and WL3' to control access to memory cells 110, 111, 112, and 113 respectively, of block 192 during an operation (e.g., read, write, or erase operation). For example, during a read operation, memory device 100 can use signals WL0', WL1', WL2', and WL3' to control access to memory cells 110, 111, 112, and 113 of block 192 to read (e.g., sense) information (e.g., previously stored information) from memory cells 110, 111, 112, and 113 of block 192. In another example, during a write operation, memory device 100 can use signals WL0', WL1', WL2', and WL3' to control access to memory cells 110, 111, 112, and 113 of block 192 to store information in memory cells 110, 111, 112, and 113 block 192.

As shown in FIG. 1, memory cells in different memory cell strings in the same a block can share the same control gate (e.g., share the same physical control gate) in that block. For example, in block 191, memory cells 110 can share control gate 150, memory cells 111 can share control gate 151, memory cells 112 can share control gate 152, and memory cells 113 can share control gate 153. In block 192, memory cells 110 can share control gate 150', memory cells 111 can share control gate 151', memory cells 112 can share control gate 152', and memory cells 113 can share control gate 153'.

FIG. 1 shows four control gates in each block (e.g., control gates 150, 151, 152, and 153 in block 191) of memory device 100 as an example. The number of control gates in each block of memory device 100 can vary (e.g., can be more than four).

As shown in FIG. 1, memory device 100 can include a line (e.g., a source line or a source plate) 198 that can carry a signal (e.g., a source line signal) SRC. Line 198 can be structured as a conductive line or a conductive plate of memory device 100. Line 198 can be common conductive line (e.g., a common source line or a common source plate) of block 191 and 192. Line 198 can be coupled to a ground connection of memory device 100.

Memory device 100 can include select gates (e.g., drain select gates) $181_1$ through $181_N$, and transistors (e.g., drain select transistors) $161_1$ through $161_N$. Transistors $161_1$ can share the same select gate $181_1$. Transistors $162_N$ can share the same select gate $181_N$. Select gates $181_1$ through $181_N$ can carry signals SGD through $SGD_N$, respectively.

Transistors $161_1$ through $161_N$ can be controlled (e.g., turned on or turned off) by signals $SGD_1$ through $SGD_N$, respectively. During a memory operation (e.g., a read or write operation) of memory device 100 transistors $161_1$ through $161_N$ can be turned on (e.g., by activating respective signals SGD through $SGD_N$) to couple the memory cell strings of block 191 to respective sets of data lines $170_1$ through $170_N$, $171_1$ through $171_N$, and $172_1$ through $172_N$. Transistors $161_1$ through $161_N$ can be turned off (e.g., by deactivating respective signals $SGD_1$ through $SGD_N$) to decouple the memory cell strings of block 191 from respective sets of data lines $170_1$ through $170_N$, $171_1$ through $171_N$, and $172_1$ through $172_N$.

Memory device 100 can include transistors (e.g., source select transistors) 160, each of which can be coupled between line 198 and the memory cells in a respective memory cell string of block 191. Transistors 160 can share the same select gate (e.g., source select gate) 180 of memory device 100. Transistors 160 can be controlled (e.g., turned on or turned off) by the same signal, such as SGS signal (e.g., source select gate signal) provided on select gate 180. During a memory operation (e.g., a read or write operation) of memory device 100, transistors 160 can be turned on (e.g., by activating an SGS signal) to couple the memory cell strings of block 191 to line 198. Transistors 160 can be turned off (e.g., by deactivating the SGS signal) to decouple the memory cell strings of block 191 from line 198.

Memory device 100 can include similar select gates and transistors in block 192. For example, memory device 100 can include select gates (e.g., drain select gates) $181'_1$ through $181'_N$, and transistors (e.g., drain select transistors) $161'_1$ through $161'_N$. Transistors $161'_1$ can share the same select gate $181'_1$. Transistors $162'_N$ can share the same select gate $181'_N$. Select gates $181'_1$ through $181'_N$ can carry signals $SGD'_1$ through $SGD'_N$, respectively.

Transistors $161'_1$ through $161'_N$ can be controlled (e.g., turned on or turned off) by signals $SGD'_1$ through $SGD'_N$, respectively. During a memory operation (e.g., a read or write operation) of memory device 100, transistors $161'_1$ through $161'_N$ can be turned on (e.g., by activating respective signals $SGD'_1$ through $SGD'_N$) to couple the memory cell strings of block 192 to respective sets of data lines $170_1$ through $171_N$, $171_1$ through $171_N$, and $172_1$ through $172_N$. Transistors $161'_1$ through $161'_N$ can be turned off (e.g., by deactivating respective signals $SGD'_1$ through $SGD'_N$) to decouple the memory cell strings of block 192 from respective sets of data lines $170_1$ through $170_N$, $171_1$ through $171_N$, and $172_1$ through $172_N$.

Memory device 100 can include transistors (e.g., source select transistors) 160', each of which can be coupled between line 198' and the memory cells in a respective memory cell string of block 192. Transistors 160' can share the same select gate (e.g., source select gate) 180' of memory device 100. Transistors 160' can be controlled (e.g., turned on or turned off) by the same signal, such as SGS' signal (e.g., source select gate signal) provided on select gate 180'. During a memory operation (e.g., a read or write operation) of memory device 100, transistors 160' can be turned on (e.g., by activating an SGS' signal) to couple the memory cell strings of block 192 to line 198. Transistors 160' can be turned off (e.g., by deactivating the SGS' signal) to decouple the memory cell strings of block 192 from line 198.

Memory device 100 includes other components, which are not shown in FIG. 1 so as not to obscure the example embodiments described herein. Some of the structure of memory device 100 is described below with reference to FIG. 2 through FIG. 6. At least a portion of memory device 100 (e.g., a portion of memory cell area 101 and the sets of data lines data lines $170_1$ through $170_9$, $171_1$ through $171_9$, and $172_1$ through $172_9$) can include structures that can be similar to (or the same as) any of the memory devices described below with reference to FIG. 7 through FIG. 31.

Figure 2:
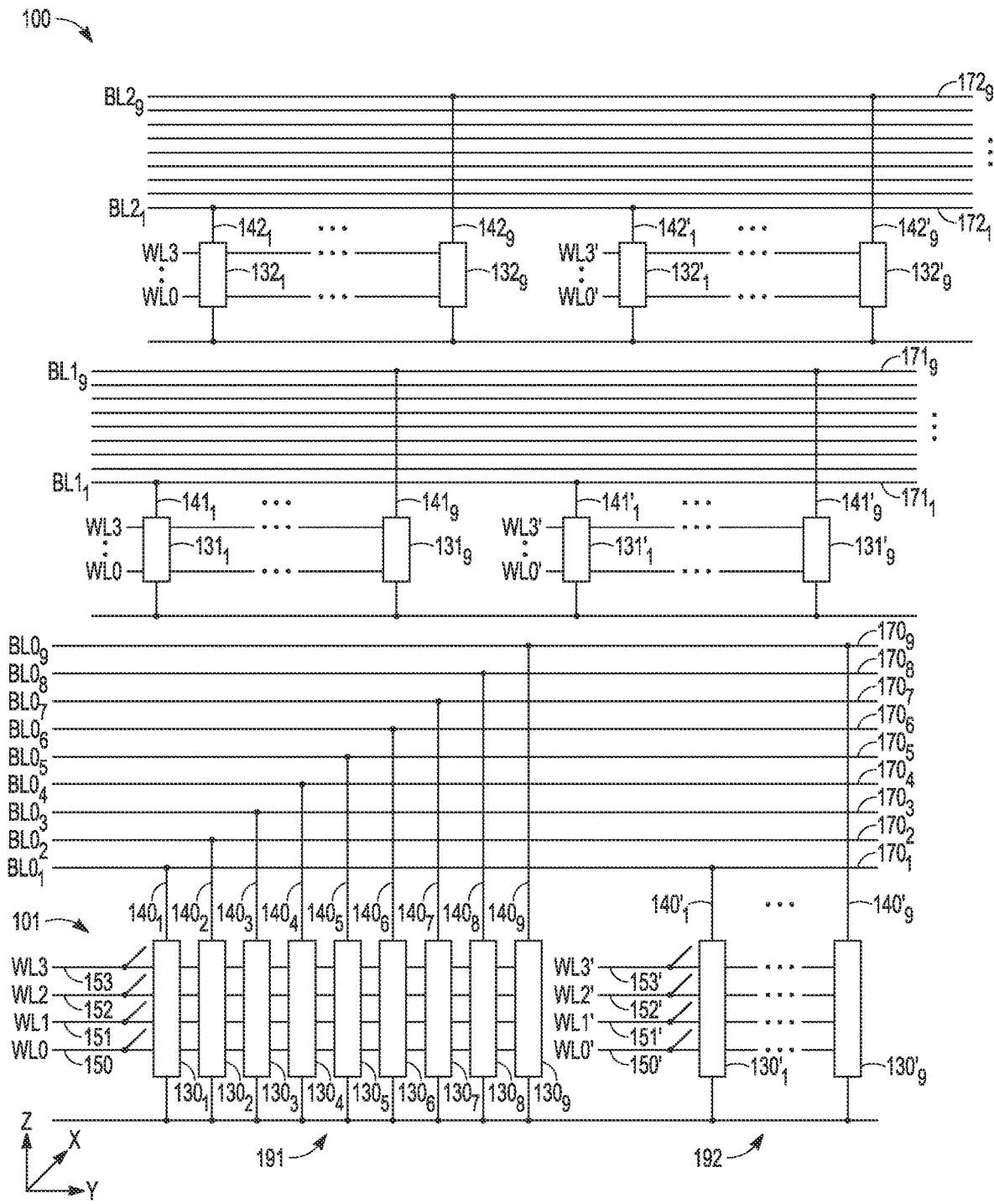
FIG. 2 shows a schematic diagram of a portion of the memory device of FIG. 1 including an example where the memory device includes nine data lines in each set of data lines, according to an embodiment of the invention.

FIG. 2 shows a schematic diagram of a portion of memory device 100 of FIG. 1 including an example where memory device 100 includes nine data lines (e.g., N=9) in each set of data lines, according to an embodiment of the invention. In FIG. 1 and FIG. 2, similar or identical elements between are given the same labels. As shown in FIG. 2, memory device 100 can include a set of nine data lines $170_1$ through $170_9$ ($170_1$, $170_2$, $170_3$, $170_4$, $170_5$, $170_6$, $170_7$, $170_8$, and $170_9$), a set of nine data lines $171_1$ through $171_1$, and a set of nine data lines $172_1$ through $172_9$.

As described above, the number of memory strings in the X-direction that are coupled to a set of data lines can be equal to the number (e.g., N) of data lines of the set of data lines. Thus, in the example of FIG. 2, each of blocks 191 and 192 can include nine memory strings in the X-direction that are coupled to a respective set of data lines. For example, in block 191, memory device 100 can include nine memory cell strings $130_1$ through $130_9$ ($130_1$, $130_2$, $130_3$, $130_4$, $130_5$, $130_6$, $130_7$, $130_8$, and $130_9$) coupled to data lines $170_1$ through $170_9$, respectively; nine memory cell strings $131_1$ through $131_9$ coupled to data lines $171_1$ through $171_9$, respectively; and nine memory cell strings $132_1$ through $132_9$ coupled to data lines $172_1$ through $172_9$, respectively.

In a similar fashion in block 192, memory device 100 can include nine memory cell strings $130'_1$ through $130'_9$ coupled to data lines $170_1$ through $170_9$, respectively; nine memory cell strings $131'_1$ through $131'_9$ coupled to data lines $171_1$ through $171_9$, respectively; and nine memory cell strings $132'_1$ through $132'_9$ coupled to data lines $172_1$ through $172_9$, respectively.

As shown in FIG. 2, memory cell strings $130_1$ through $130_9$ can be coupled to data lines $170_1$ through $170_9$ through conductive connections $140_1$ through $140_9$, respectively. Memory cell strings $130'_1$ through $130'_9$ can be coupled to data lines $170_1$ through $170_9$ through conductive connections $140'_1$ through $140'_9$, respectively.

In similar connections, memory cell strings $131_1$ through $131_9$ can be coupled to data lines $171_1$ through $171_9$ through conductive connections $141_1$ through $141_9$, respectively. Memory cell strings $131'_1$ through $131'_9$ can be coupled to data lines $171_1$ through $171_9$ through conductive connections $141'_1$ through $141'_9$, respectively.

Memory cell strings $132_1$ through $132_9$ can be coupled to data lines $172_1$ through $172_9$ through conductive connections $142_1$ through $142_9$, respectively. Memory cell strings $132'_1$ through $132'_9$ can be coupled to data lines $172_1$ through $172_9$ through conductive connections $142'_1$ through $142'_9$, respectively.

The memory cell strings in the X-direction in one block (e.g., block 191) can be coupled to a particular set of data lines in the same way that memory cell strings in the X-direction in another block (e.g., block 191) are coupled that particular set of data lines. For example, as shown in FIG. 2, memory cell strings $130_1$ through $130_9$ in block 191 can be coupled (e.g., coupled in a sequential order) to data lines $170_1$ through $170_9$ in the same way that memory cell strings $130'_1$ through $130'_9$ in block 192 are coupled (e.g., coupled in a sequential order) to data lines $170_1$ through $170_9$. Thus, in a physical structure of memory device 100, conductive connections $140_1$ through $140_9$ can have similar (or the same) structures as conductive connections $141_1$ through $141_9$ FIG. 2 shows example connections (e.g., sequential connections) between memory cell strings in the X-direction (e.g., memory cell strings $131'_1$ through $131'_9$) and a respective set of data lines (data lines $171_1$ through $171_9$). However, the connections between memory cell strings in the X-direction and a respective set of data lines can be different from the example connections shown in FIG. 2, as long as one memory cell string in the X-direction can be coupled to a respective data line of a set of data lines. For example, FIG. 2 shows that memory cell strings $130_1$, $130_2$, $130_3$, $130_4$, $130_5$, $130_6$, $130_7$, $130_8$, and $130_9$ are coupled data lines $170_1$, $170_2$, $170_3$, $170_4$, $170_1$, $170_6$, $170_7$, $170_8$, and $170_9$, respectively. However, memory cell strings $130_1$ through $130_9$ can be coupled to data lines $170_1$ through $170_9$ in a different way (e.g., not in a sequential order shown in FIG. 2), as long as memory cell strings $130_1$ through $130_9$ and data lines $170_1$ through $170_9$ can be coupled to each other in a one-to-one connections (e.g., memory cell strings $130_1$ through $130_9$ have no shared connections with data lines $170_1$ through $170_9$).

FIG. 3A shows a side view (e.g., a cross section with respect to the Z-Y directions) of a structure of a portion of memory device 100 of FIG. 2 including the structure of data lines $170_1$ through $170_9$ and a structure of a memory cell string 130 of memory device 100, according to some embodiments described herein. For simplicity, detailed description of the same element is not repeated from one figure to the next. Also for simplicity, cross-sectional lines (e.g., hatch lines) are omitted from most of the elements shown in the drawings described herein. Some elements of memory device 100 and other memory devices (e.g., memory device 700) described herein may be omitted from a particular figure of the drawings so as to not obscure the description of the element (or elements) being described in that particular figure. The dimensions (e.g., physical structures) of the elements shown in the drawings described herein are not scaled.

In FIG. 3A, the structure of memory cell string 130 can be the structure of one of memory cell strings $130_1$ through $130_9$ of block 191 of memory device 100. Other memory cell strings (FIG. 1 and FIG. 2) of memory device 100 can have a structure similar to (or the same as) the structure of memory cell string 130.

As shown in FIG. 3A, data lines $170_1$ through $170_9$ can have respective lengths extending in the Y-direction. Each of data lines $170_1$ through $170_9$ can have a thickness (which is less than the length) in the Z-direction. Data lines $170_1$ through $170_9$ and be located (e.g., stacked over one another) in different levels (e.g., layers) 301 through 309, respectively, of memory device 100. As shown in FIG. 3A, levels 301 through 309 are located in a portion of memory device 100 that is over (with respect to the Z-direction) memory cell area 101. Memory cell area 101 is located over a substrate 390 of memory device 100. As described above with reference to FIG. 1, memory cell area 101 is where the memory cell strings (one of which is shown as memory cell string 130) of memory device 100 can be formed.

In FIG. 3A, a conductive structure 314 can be part of one of conductive connections $140_1$ through $140_9$ (FIG. 2) of memory device 100, conductive structure 314 can include (e.g., can be formed from) a conductive material (e.g., metal, conductively doped polysilicon, or other conductive materials). Conductive structure 314 can have a structure (e.g., vertical structure) of material that extends in the Z-direction through levels 301 through 309. Conductive structure 314 can be electrically coupled to (e.g., can contact) one of data lines $170_1$ through $170_9$ and electrically separated from (e.g., not contact with) the rest of data lines $170_1$ through $170_9$. For example, as shown in FIG. 3A, conductive structure 314 can be electrically coupled to data line $170_7$ at a portion (e.g., a landing pad) 307 of data line $170_7$. FIG. 3A shows a separation (e.g., a gap) between conductive structure 314 and each of data lines $170_1$ through $170_6$ and data lines $170_8$ and $170_9$ (except data line $170_7$) to indicate that conductive structure 314 is electrically separated from data lines $170_1$ through $170_6$, and data lines $170_8$ and $170_9$.

FIG. 3A shows conductive structure 314 being coupled to data line $170_7$ as an example. However, conductive structure 314 can be coupled to a different data line among data lines $170_8$ and $170_N$ as long as conductive structure 314 is electrically coupled to at most one (only one) data of a set of data lines (e.g., coupled to only one of data lines $170_1$ through $170_9$)

As shown in FIG. 3A, memory cell string 130 can include a pillar (e.g., a vertical pillar) 330. Pillar 330 can include (e.g., can be formed from) a conductive material (e.g., conductively doped polysilicon). As shown in FIG. 3A, pillar 300 can have a length that extends in the Z-direction (e.g., extend vertically with respect to substrate 390). The memory strings (e.g., memory cell strings $130_1$ through $130_9$ in FIG. 1) of memory device 100 can include respective pillars and each of which can be similar to (or the same as) pillar 330.

Memory cell string 130 can include a conductive contact 340, which can be part of pillar 330 of memory cell string 130. Conductive contact 340 can be formed from metal or other conductive material. Pillar 330 can include a portion 344. Conductive contact 340 and portion 344 of pillar can include the same conductive material or different conductive materials.

Conductive structure 314 and pillar 330 can be part of a circuit path (e.g., a conductive channel of memory cell string 130) between data line $170_7$ and a conductive region 398 (associated with signal SRC). Conductive region 398 can be part of line (e.g., source line or source plate) 198 in FIG. 1. In FIG. 3A, during a memory operation (e.g., read or write operation) of memory device 100, a circuit path (e.g., a current path) can be formed between data line $170_7$ and conductive region 398 through conductive structure 340 and pillar 330.

As shown in FIG. 3A, conductive contact 340 can be located at one side (e.g., drain side) of memory cell string 130 that is closer to data lines $170_8$ and $170_9$ than another side (e.g., source side) next to a conductive region 398 (which can be part of line (e.g., source line of source plate) 198 in FIG. 1). Thus, conductive contact 340 in FIG. 3A can be called drain contact of memory cell string 130.

Substrate 390 of memory device 100 can include a semiconductor substrate (e.g., silicon-based substrate). For example, substrate 390 can include a p-type silicon substrate or an n-type silicon substrate. As shown in FIG. 3A, memory cells 110, 111, 112, and 113 of memory cell string 130 can be located along respective portions of pillar 330 in different levels of memory device 100 in the Z-direction. For example, memory cells 110, 111, 112, and 113 can be located one over another (e.g., formed vertically) in levels 350, 351, 352, and 353, respectively.

Control gates 150, 151, 152, and 153 can be located along respective portions (in the Z-direction) of pillar 330 in the same levels (e.g., levels 350, 351, 352, and 353, respectively) that memory cells 110, 111, 112, and 113 are located. Control gates 150, 151, 152, and 153 can include (e.g., can be formed form) a conductive material (e.g., metal, doped polysilicon, other conductive materials).

In FIG. 3A, select gate 180 is the same select gate 180 shown in FIG. 1. Select gate 181 in FIG. 3A can be one of select gates $181_1$ through $181_N$ (FIG. 1). Transistor 161 can be one of transistors $161_1$ through $161_N$. As shown in FIG. 3A, transistors 160 and 161 can be located along respective portions of pillar 330 in the Z-direction. The materials of select gates 180 and 181 can include a conductive material (e.g., conductively doped polysilicon, metal, other conductive material).

Memory cell string 130 can include materials 303, 304, 305 between portion 344 of pillar 330 and a respective control gate among control gates 150, 151, 152, and 153. Material 303 can also be between pillar 330 and each of select gates 180 and 181. As shown in FIG. 3A, materials 303, 304, and 305 can be separated among memory cells 110, 111, 112, and 113. Materials 303, 304, and 305 located at particular memory cell (among memory cells 110, 111, 112, and 113) can be part (e.g., a memory element) of that particular memory cell.

Material 303 can include a charge blocking material (or charge blocking materials), for example, a dielectric material (e.g., silicon nitride) that is capable of blocking a tunneling of a charge.

Material 304 can include a charge storage material (or charge storage materials) that can provide a charge storage function to represent a value of information stored in memory cell 310, 311, 312, and 313. For example, material 304 can include polysilicon (e.g., conductively doped polysilicon), which can be either a p-type polysilicon or an n-type polysilicon. The polysilicon can be configured to operate as a floating gate (e.g., to store charge) in a memory cell (e.g., a memory cell 310, 311, 312, or 313). In another example, material 304 can include a dielectric material (e.g., silicon-nitride based material or other dielectric materials) that can trap charge in a memory cell (e.g., a memory cell 310, 311, 312, or 313).

Material 305 can include a tunnel dielectric material (or tunnel dielectric materials), for example, silicon dioxide, that is capable of allowing tunneling of a charge (e.g., electrons).

As shown in FIG. 3A, memory device 100 can include circuitry 395 located (e.g., formed) under memory cell area 101 (e.g., located directly under memory cell string 130). Circuitry 395 can include circuit elements (e.g., transistors T) coupled to other circuit elements (e.g., coupled to data lines $170_1$ through $170_9$) of memory device 100. The circuit elements (e.g., transistors T) of circuitry 395 can be configured to perform part of a function of a memory device (e.g., memory device 100). For example, circuitry 395 can include decoder circuits, driver circuits, buffers, sense amplifiers, charge pumps, and other circuitry of memory device 100.

Different views of pillar 330 along lines 3B-3B and 3C-3C are shown in FIG. 3B and FIG. 3C, respectively. FIG. 3B shows a top view (e.g., a cross section respect to the X-Y plan) of portion 344 of pillar 330 along line 3B-3B of FIG. 3A. FIG. 3C shows a top view (e.g., a cross section respect to the X-Y plan) of conductive contact 340 of pillar 330 along line 3C-3C of FIG. 3A.

As shown in FIG. 3B, portion 344 can include material 344A and material 344B surrounded by material 344A. Material 344A can be (or can include) part of a conductive structure (e.g., a conductive channel) of pillar 330. Material 334B can include a dielectric material. In an alternative structure of pillar 330, material 344B can omitted from pillar 330, such that the entire portion 344 of pillar 330 can include material 344 (without material 344B).

FIG. 3B shows a top view (e.g., a cross section respect to the X-Y plan) of portion 344 of pillar 330 along line 3C-3C of FIG. 3A. FIG. 3C shows a top view (e.g., a cross section respect to the X-Y plan) of conductive contact 340 of pillar 330 along line 3B-3B of FIG. 3A.

As shown in FIG. 3C, the shape of conductive contact 340 (e.g., in a top view) can be relatively circular. Similarly, in FIG. 3C, the shape of portion 344 (e.g., in a top view) can be relatively circular. Other conductive contacts (e.g., drain contacts) of memory cell strings (shown in FIG. 1 and FIG. 2) of memory device 100 can be have a similar shape (from a top view) as the shape of conductive contact 340.

Figure 4:
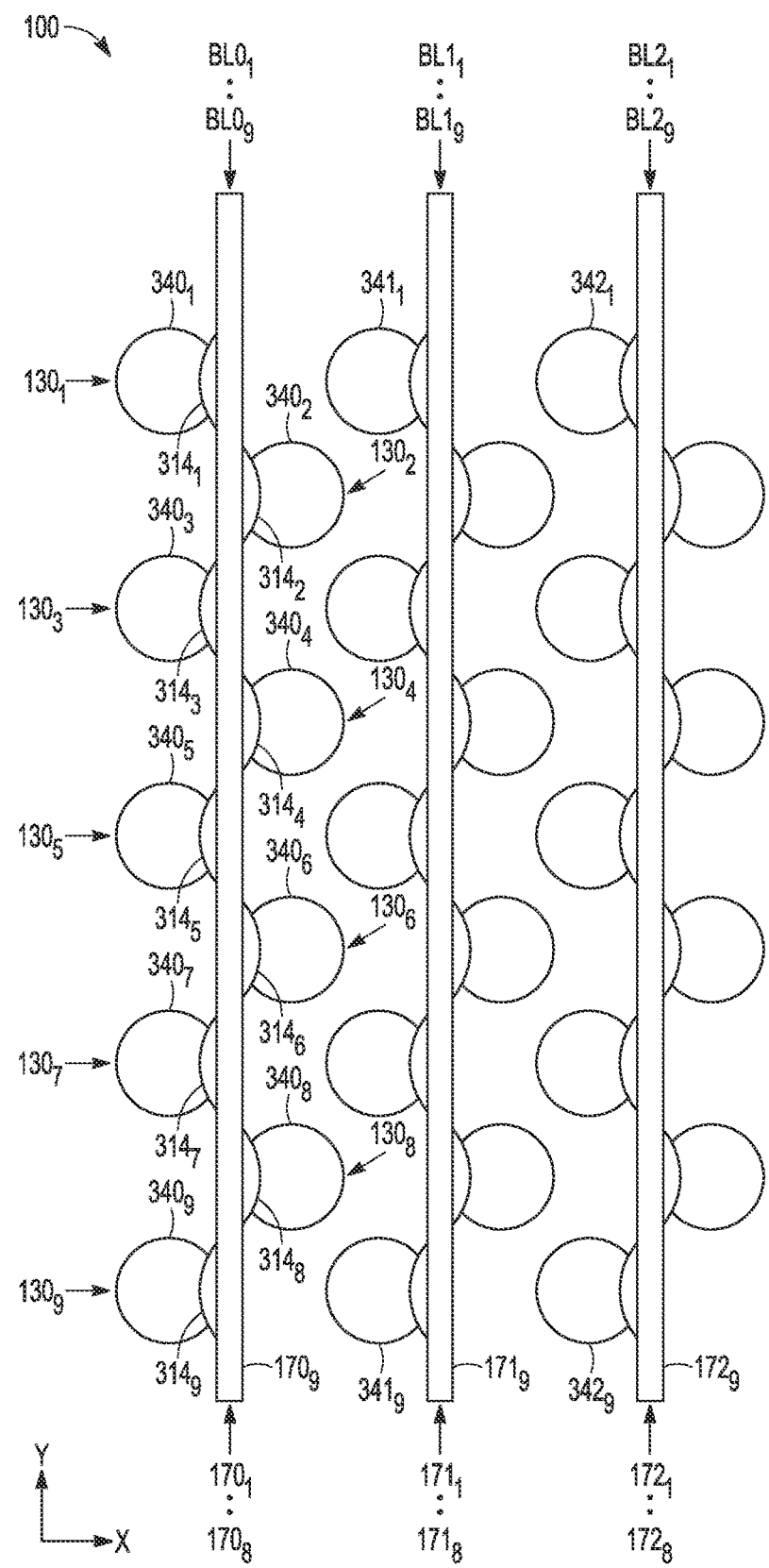
FIG. 4 shows a top view of a structure of the memory device including data lines and conductive contacts (e.g., drain contacts) of respective memory cell strings of the memory device of FIG. 2, according to some embodiments described herein.

FIG. 4 shows a top view of a structure of memory device 100 including data lines $170_1$ through $170_9$, $171_1$ through $171_9$, and $172_1$ through $172_9$, and conductive contacts (e.g., drain contacts) $340_1$ through $340_9$ of respective memory cell strings $130_1$ through $130_9$ of memory device 100, according to some embodiments described herein.

FIG. 4 also shows conductive contacts (e.g., drain contacts) $341_1$ through $341_9$ (only conductive contacts $341_1$ and $341_9$ are labeled) and conductive contacts (e.g., drain contacts) $342_1$ through $342_9$ (only conductive contacts $342_1$ and $342_9$ are labeled) of other respective memory cell strings (not labeled) of memory device 100. As shown in FIG. 4, each of conductive contacts $340_1$ through $340_9$, $341_1$ through $341_9$, and $342_1$ through $342_9$ can have a shape (from atop view) similar to the shape (e.g., circular) conductive contact 340 of pillar 330 of memory cell string 130 in FIG. 3A, FIG. 3B, and FIG. 3C. Conductive contacts $340_1$ through $340_9$, $341_1$ through $341_9$, and $342_1$ through $342_9$ are located under (in the Z-direction) respective stacks of data lines $170_1$ through $170_9$, $171_1$ through $171_9$, and $172_1$ through $172_9$. As shown in FIG. 4, data lines $170_1$ through $170_9$ data lines $171_1$ through $171_9$, and data lines $172_1$ through $172_9$ can have lengths extending in the Y-direction.

Conductive contacts $340_1$ through $340_9$ can be located along the lengths (in the Y-direction) and on both sides (in the X-directions) of the stack of data lines $170_1$ through $170_9$. In similar fashion, conductive contacts $341_1$ through $341_9$ can be located along the lengths (in the Y-direction) and on both sides (in the X-directions) of the stack of data lines $171_1$ through $171_9$. Conductive contacts $342_1$ through $342_9$ can be located along the lengths (in the Y-direction) and on both sides (in the X-directions) of the stack of data lines $172_1$ through $172_9$.

FIG. 4 also shows conductive structures $314_1$ through $314_9$ and other conductive structures (not labeled) of memory device 100. As shown in FIG. 4, the conductive structures can be alternatively formed on the sides (e.g., left and right sides in the X-direction) of the stack of data lines $171_1$ through $171_9$.

Each of the conductive structures (e.g., conductive $314_1$ through $314_9$) can overlap (with respect to the top view) and contact (e.g., electrically coupled to) a respective conductive contact. For example, conductive structure $314_1$ can overlap and contact conductive contact $340_1$, conductive structure $314_2$ can overlap and contact conductive contact $340_2$, and so on.

As shown in FIG. 4, each of the conductive structures (e.g., conductive structures $314_1$ through $314_9$) can also contact (e.g., electrically coupled to) a respective data line of a stack of data lines at a portion (e.g., a landing pad directly under a portion of a respective conductive structure from a top view) of the respective data line that can be a protrusion portion of the respective data line. For example, conductive structure $314_1$ can contact data line $170_9$ at a portion 501 (shown in FIG. 5) that can be a protrusion portion (e.g., an integral part) of data line $170_1$, and conductive structure $314_3$ can contact data line $170_5$ at a portion 503 (shown in FIG. 5) that can be a protrusion portion (e.g., an integral part) of data line $170_5$.

As described above with reference to FIG. 2 and FIG. 3, memory device 100 can have example of nine data lines (e.g., N=9) in each set of data lines. As shown in FIG. 4, the set of data lines $170_1$ through $170_9$ (associated signals $BL0_1$ through $BL0_9$) can be formed in a stack of nine data lines that are stacked in the Z-direction one over another. For example, as shown in FIG. 4, data line $170_9$ can be the topmost data line and data lines $170_1$ through $170_8$ (which are hidden under data line $170_9$) can be under (below in the Z-direction) data line $170_9$.

In a similar formation, the set of data lines $171_1$ through $171_9$ (associated signals $BL1_1$ through $BL1_9$) can be formed in a stack of nine data lines that are stacked in the Z-direction one over another. For example, as shown in FIG. 4, data line $171_9$ can be the topmost data line and data lines $171_1$ through $171_8$ (which are hidden under data line $171_9$) can be under (below in the Z-direction) data line $170_9$.

The set of data lines $172_1$ through $172_9$ (associated signals $BL2_1$ through $BL2_9$) can be formed in a stack of nine data lines that are stacked in the Z-direction one over another. For example, as shown in FIG. 4, data line $172_9$ can be the topmost data line and data lines $172_1$ through $172_8$ (which are hidden under data line $172_9$) can be under (below in the Z-direction) data line $172_9$.

Figure 5:
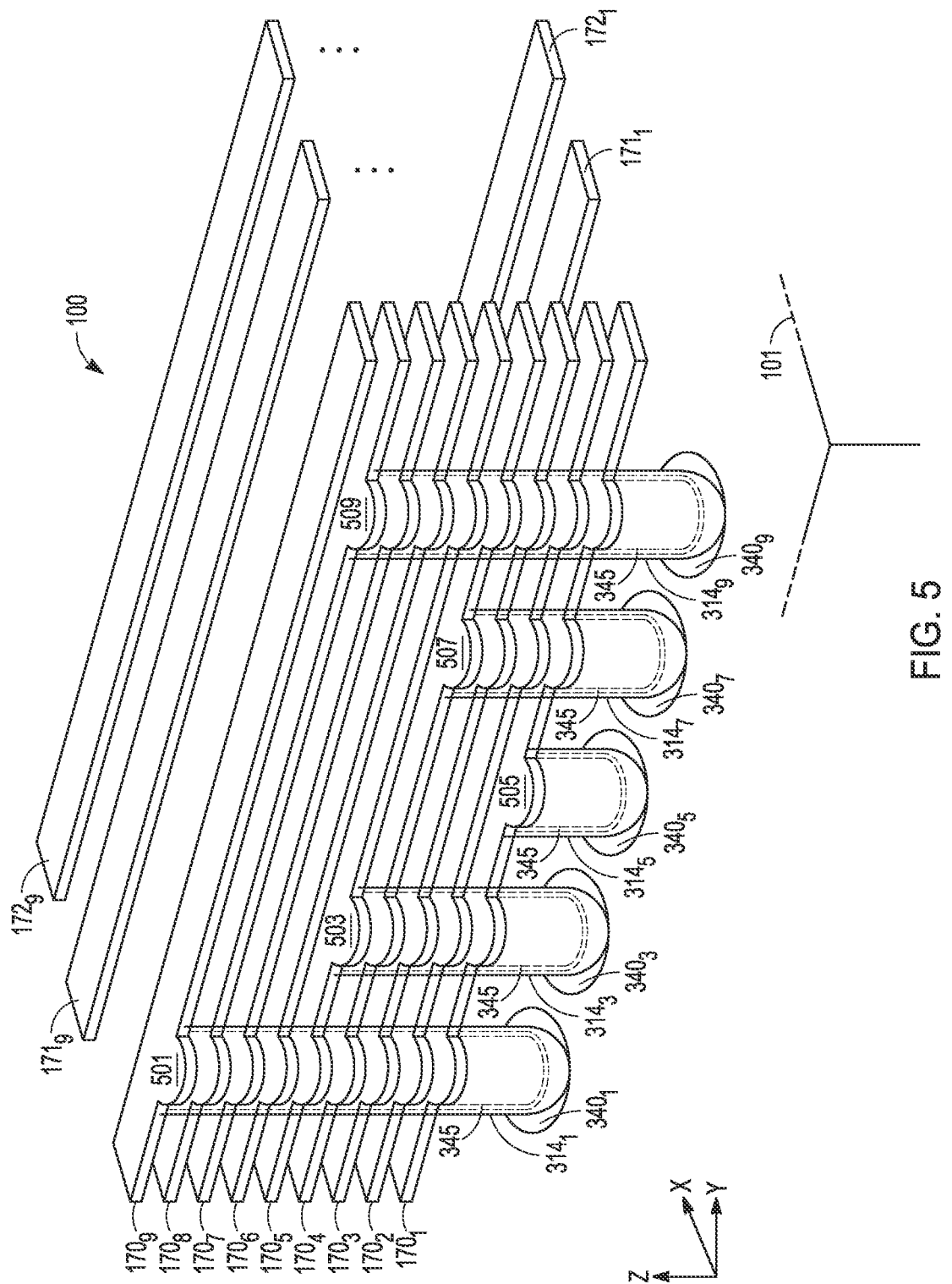
FIG. 5 shows an isometric view of portion of a structure of the memory device of FIG. 4 including a memory cell area and the stacks of data lines of the memory device, according to some embodiments described herein.

FIG. 5 shows an isometric view of portion of a structure of memory device 100 of FIG. 4 including memory cell area 101 and the stacks of data lines $1701$ through $170_9$, $171_1$ through $171_9$, and $172_1$ through $172_9$, according to some embodiments described herein. As shown in FIG. 5, the set of data lines $1701$ through $170_9$ can be formed in a stack of nine data lines. The set of data lines $1701$ through $171_9$ can be formed in another stack of nine data lines (e.g., next to the stack of data lines $1701$ through $170_9$). The set of data lines $172_1$ through $172_9$ can be formed in another stack of nine data lines (e.g., next to the stack of data lines $171_1$ through $171_9$). The stacks of data lines $170_1$ through $170_9$, $171_1$ through $171_9$, and $172_1$ through $172_9$ can be located side by side with each other (in the X-direction) and located on the same level of memory device 100.

As shown in FIG. 5, each of data lines $170_1$ through $170_9$ can include (e.g., can be formed from) a structure (e.g., a piece (e.g., a layer)) of conductive material. Thus, the set of data lines $170_1$ through $170_9$ can include nine separated structures (e.g., pieces) of material stacked one over another over memory cell area 101. In a similar formation, the set of data lines $170_1$ through $171_9$ can be formed in another stack of nine structures (e.g., pieces (e.g., layers)) of conductive materials (e.g., next to the stack of data lines $170_1$ through $170_9$). The set of data lines $172_1$ through $172_9$ can be formed in another stack of nine structures (e.g., pieces (e.g., layers)) of conductive materials (e.g., next to the stack of data lines $171_1$ through $171_9$). Example materials for data lines $170_1$ through $170_9$, $1701$ through $171_9$, and $172_1$ through $172_9$ include metal, conductively doped polysilicon, or other conductive materials.

FIG. 5 also shows some of the conductive contacts (e.g., conductive contacts $340_1$, $340_3$, $340_5$, $340_7$, and $340_9$) and corresponding conductive structures (e.g., conductive structures $314_1$, $314_3$, $314_5$, $314_7$, and $314_9$) of memory device 100. Conductive structures $314_1$, $314_3$, $314_5$, $314_7$, and $314_9$ can be parts of conductive connections $140_1$, $140_3$, $140_5$, $140_7$, and $140_9$ (FIG. 2), respectively, of memory device 100. For simplicity, FIG. 5 omits other conductive contacts (e.g., conductive contacts $340_2$, $340_4$, $340_6$, $340_8$, and $3411$ through $341_9$, and $342_1$ through $342_9$ shown in FIG. 4) and corresponding conductive structures coupled to the conductive contacts of memory device 100.

As shown in FIG. 5, conductive structures $314_1$, $314_3$, $314_5$, $314_7$, and $314_9$ can be coupled to respective data lines $170_9$, $170_5$, $170_1$, $170_4$, and $170_8$ at portions (e.g., landing pads) 501, 503, 505, 507, and 509, respectively. Portions 501, 503, 505, 507, and 509 can be parts (e.g., integral parts) of data lines $170_9$, $170_5$, $170_1$, $170_4$, and $170_8$, respectively. Thus, the materials of portions 501, 503, 505, 507, and 509 can be the same as the materials of data lines $170_9$, $170_5$, $170_1$, $170_4$, and $170_8$, respectively. In FIG. 5, each of portions 501, 503, 505, 507, and 509 can be a protrusion portion of a respective data line in which the protrusion portion can protrudes from a side of the respective data line in a direction (e.g., the X-direction) perpendicular to the length of the respective data line.

As shown in FIG. 5, memory device 100 can include spacers (e.g., vertical dielectric spacers) 345. Spacers 345 can form dielectric structures that electrically separate a respective conductive structure among conductive structures $314_1$, $314_3$, $314_5$, $314_7$, and $314_9$ from the stack of data lines $170_1$ through $170_9$.

As described above with reference to FIG. 1 through FIG. 5, the data lines (e.g., data lines $170_1$ through $170_9$) can be shared among the blocks (e.g., blocks 191 and 192 in FIG. 1 and FIG. 2). Thus, the stacks of data lines $170_1$ through $170_9$ in FIG. 5 can extend across (e.g., formed over) the blocks of memory device 100 and can be coupled to respective conductive contacts (e.g., drain contacts) of respective memory cell strings in each of the blocks.

Figure 6:
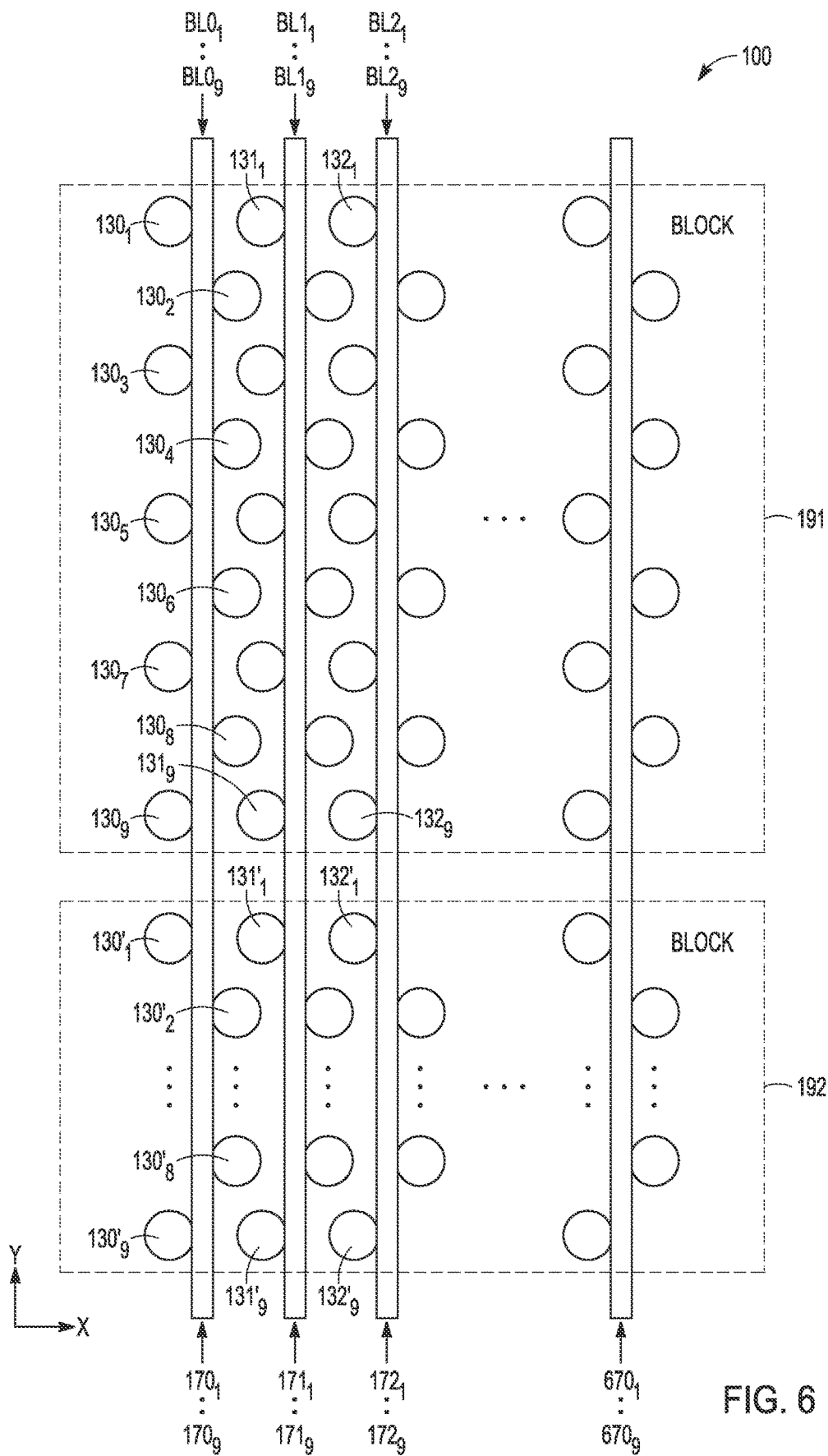
FIG. 6 shows a top view of a structure of the memory device of FIG. 1 and FIG. 2 including blocks of memory cells and the stacks of data lines of the memory device, according to some embodiments described herein.

FIG. 6 shows a top view of a structure of memory device 100 including blocks 191 and 192 and the stacks of data lines $170_1$ through $170_9$, $171_1$ through $171_9$, and $172_1$ through $172_9$, according to some embodiments described herein. FIG. 6 also shows a stacks of data lines $670_1$ through $670_9$ and conductive contacts (not labeled) along the stacks of data lines $670_1$ through $670_9$. For simplicity, FIG. 6 omits other stacks of data lines and conductive contacts between stack of data lines $172_1$ through $172_9$ and the stack of data lines $670_1$ through $670_9$. As shown in FIG. 6, the stacks of data lines $170_1$ through $170_9$, $171_1$ through $171_9$, and $172_1$ through $172_9$ can extend in the Y-direction across blocks 191 and 192. The conductive contacts (not labeled in FIG. 6) of memory cell strings $130_1$ through $130_9$, $131_1$ through $131_9$, and $1321$ through $132_9$ can be located under and along respective stacks of data lines $170_1$ through $170_9$, $171_1$ through $171_9$, and $172_1$ through $172_9$.

The stack structure of the data lines of memory device 100 and other memory devices (e.g., memory device 700 described below with reference to FIG. 7 through FIG. 31) allow the memory devices described herein to have improvements and benefits over some conventional memory devices. For example, the described stack data lines (e.g., the stacks of data lines $170_1$ through $170_9$, $171_1$ through $171_9$, and $172_1$ through $172_9$ (FIG. 1 through FIG. 6) and the stacks of data lines in FIG. 7 through FIG. 31) can increase the density of data lines for a given device area of the memory device (e.g., memory devices 100 and 700). This can allow more memory cells (e.g., more memory cell strings) for a given device area to be coupled the stacked data lines, thereby increasing the memory cell density of the memory device for a given area.

Further, some conventional memory devices may have spacing (e.g., horizontal spacing) constraint that limits the number pillars of memory cell strings to be coupled to the data lines in such conventional memory devices. Therefore, some of the memory cell strings in such conventional memory devices may be unused (e.g., wasted). The stacked the data lines described herein can remove such constraint and allow a relatively higher number of memory cell strings to be coupled to the stacked data lines. This can also increase the memory cell density for a given area of the described memory devices in comparison with some conventional memory devices.

Moreover, some applications may have a demand that includes a relatively higher number of memory cells for a specific device area. To accommodate such a demand, the pillar density (e.g., memory cell string density) for the specific device area of the memory device can be increased. Thus, the number of data lines may also increase. The stacked data lines described herein can allow data line density to keep pace with such pillar density (e.g., memory cell string density), thereby allowing the memory devices described herein to be suitable for such applications.

FIG. 7 through FIG. 31 show different views of elements during processes of forming a memory device 700, according to some embodiments described herein. Some or all of the processes used to form memory device 700 can be used to form memory device 100 described above with reference to FIG. 1 through FIG. 6.

Figure 7:
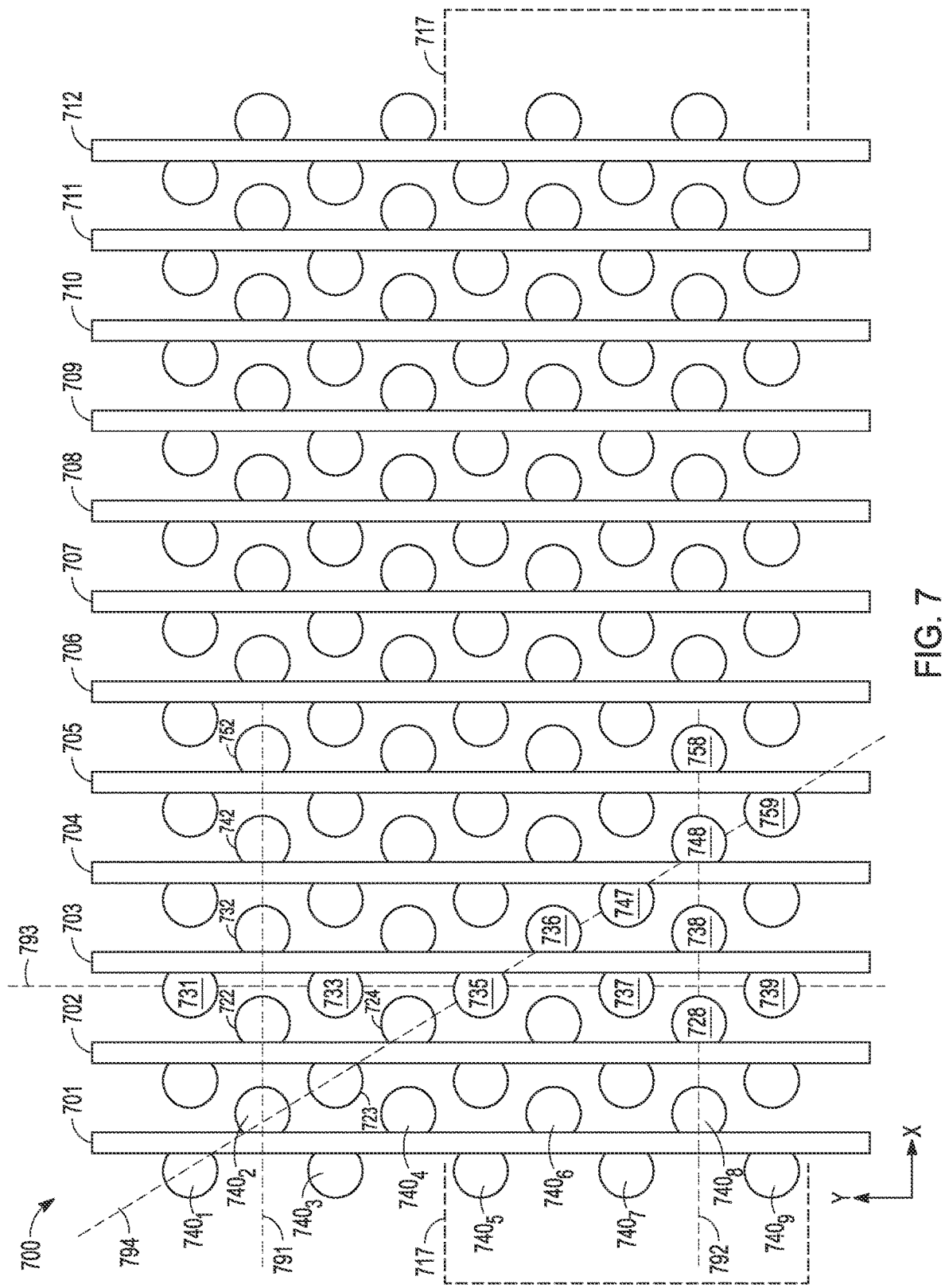
FIG. 7 through FIG. 31 show different views of elements during processes of forming a memory device including forming stacks of data lines of the memory device, according to some embodiments described herein.

FIG. 7 shows a top view of memory device 700 including conductive contacts $740_1$ through $740_9$ that have been formed. Conductive contacts $740_1$ through $740_9$ can correspond conductive contacts $340_1$ through $340_9$ (FIG. 4), respectively, of memory device 100. Conductive contacts $740_1$ through $740_9$ can be parts of pillars (under conductive contacts $740_1$ through $740_9$) of memory cell strings (hidden from the top view of FIG. 7) of memory device 700. The memory cell strings and corresponding pillars (which include conductive contacts $740_1$ through $740_9$) of memory device 700 have been formed in processes (not described herein) that are preceded the processes of forming memory device 700 associated with FIG. 7. FIG. 7 also shows other conductive contacts (of other pillars and corresponding memory cell strings) of memory device 700. For simplicity, FIG. 7 shows labels for only some of the other conductive contacts of memory device 700 are labeled, such as conductive contacts 722, 723, 724, 728, 731, 732, 733, 735 through 739, 742, 747, 748, 752, 758, and 759).

FIG. 7 also shows hard masks 701 through 712 formed over other materials (described in detail below) and over the conductive contacts of memory device 700. Each of hard masks 701 through 712 can be formed to have length extending in the Y-direction and a width in X-direction. The material for hard masks 701 through 712 can include tungsten or other materials that can be impervious to processes (e.g., trimming and etching process) performed on other materials (e.g., silicon dioxide, silicon nitride, and the material for photo resist structures) during formation of the stacks of data lines of memory device 700.

The processes of forming memory device 700 associated with FIG. 7 also form other materials (shown in FIG. 8) under hard masks 701 through 712 and over the conductive contacts of memory device 700. Lines 792, 793, 791, and 794 in FIG. 7 show locations of memory device 700 where different views (e.g., cross sections) of memory device 700 are shown in subsequent figures.

FIG. 7 also shows a location 717 (e.g., an area indicated by the dashed rectangular) that can span across part of memory device 700. As described below (e.g., with reference to FIG. 17, FIG. 18, and FIG. 19), the processes of forming the stacks of data lines of memory device 700 can include forming a resist structure (e.g., resist structure 1717 in FIG. 17, FIG. 18, and FIG. 19) at location 717 to cover the materials in a portion (e.g., the portion at location 717) of memory device 700. A process described below with reference to FIG. 19 can selectively remove a portion of the materials that is not covered by the resist structure (e.g., resist structure 1717). Such a process is part of forming staircase structures in the materials that are used to form the stacks of data lines of memory device 700.

Figure 8:
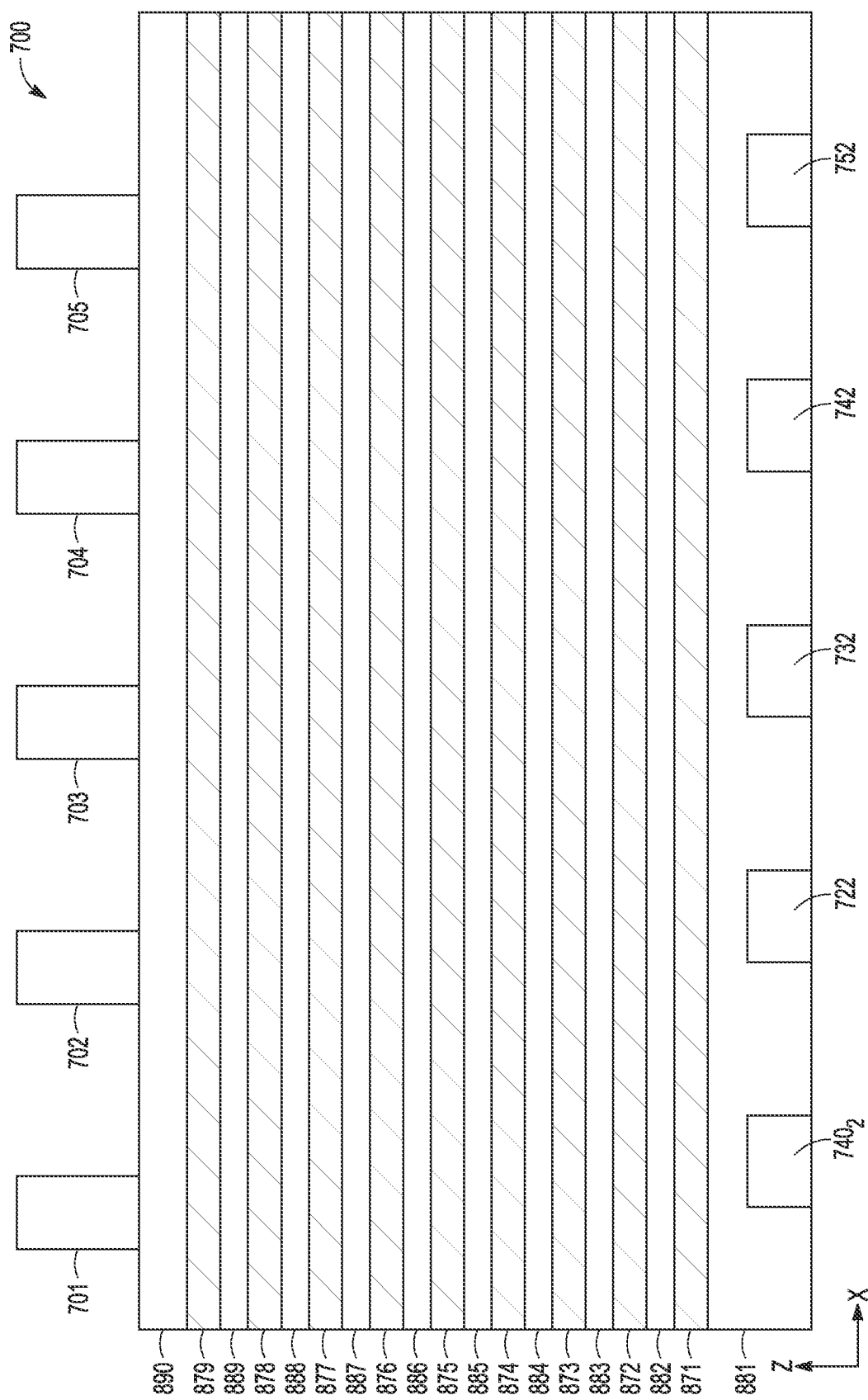

FIG. 8 shows a portion (e.g., a cross section at line 791 in FIG. 7) of memory device 700 after different levels (e.g., layers) of materials are formed in respective levels (e.g., layers) of memory device 700 over the conductive contacts (e.g., conductive contacts $740_2$, 722, 732, 742, and 752) of memory device 700. The different levels of materials (formed the process associated with FIG. 8) include materials 871 through 879 and materials 881 through 890. Materials 871 through 879 can include silicon nitride. Materials 881 through 890 can include silicon dioxide. Materials 871 through 879, and materials 881 through 890 can be formed in a sequential fashion one material after another over conductive contacts $740_2$, 722, 732, 742, and 752. For example, the processes used in FIG. 8 can include forming (e.g., depositing) material 881 over conductive contacts $740_2$, 722, 732, 742, and 752, forming (e.g., depositing) material 871 over material 881, forming (e.g., depositing) material 882 over material 871, and so on until material 890 is formed.

Materials 871 through 879, and materials 881 through 890 are also formed over other conductive contacts (e.g., the conductive contacts shown in FIG. 7) of memory device 700. However, only a portion (e.g., portion along line 791 in FIG. 7) of memory device 700 is shown in FIG. 8 for simplicity.

As shown in FIG. 8, hard masks 701 through 705 can be formed over materials 871 through 879 and materials 881 through 890. Hard masks 701 through 705 can formed after over materials 871 through 879 and materials 881 through 890. Although not shown in FIG. 8, other hard masks (e.g., hard masks 706 through 712 in FIG. 7) can also be formed over materials 871 through 879 and materials 881 through 890.

Figure 9:
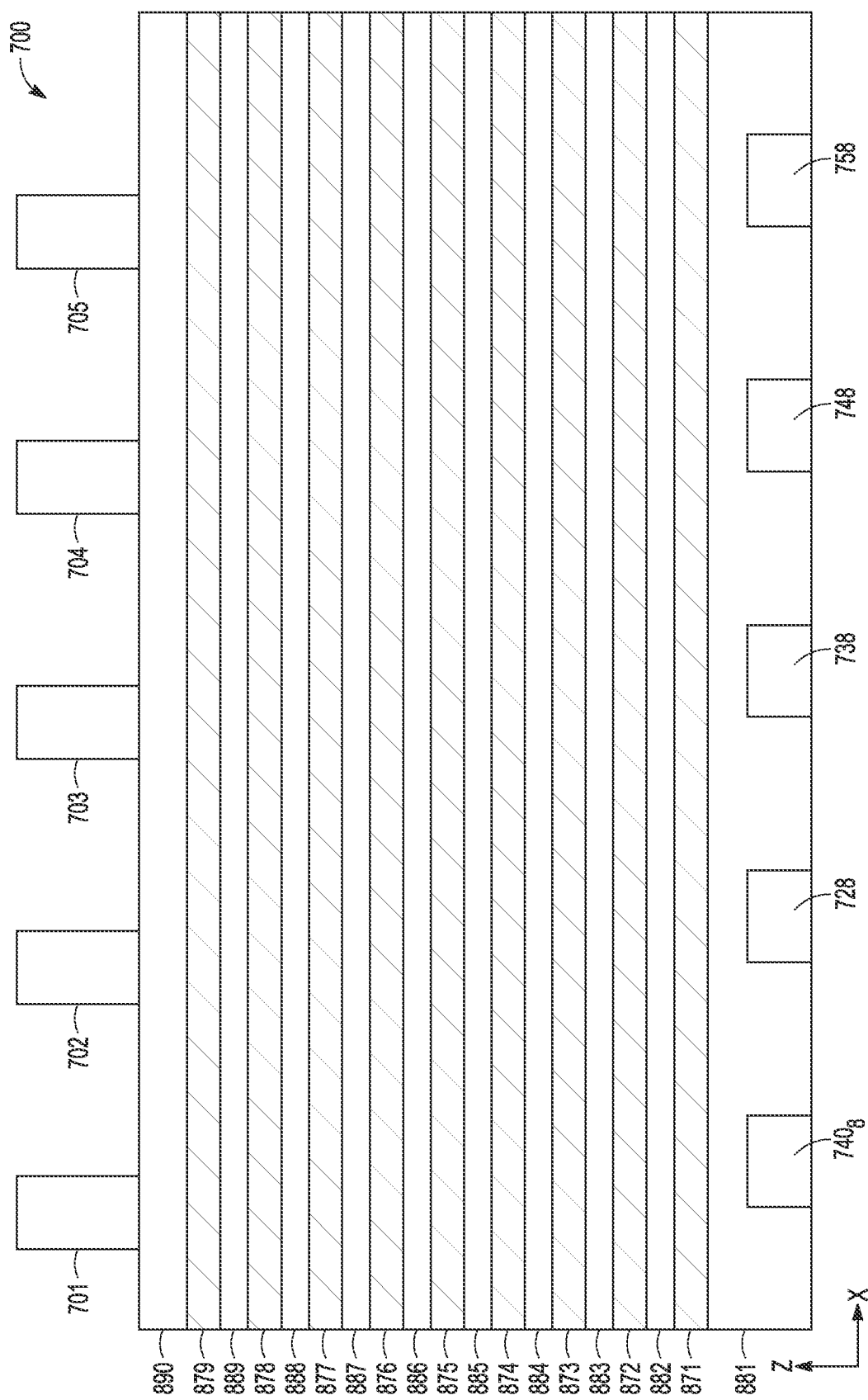

FIG. 9 also shows materials 871 through 879 and materials 881 through 890 at another a portion (e.g., a portion a cross section at line 792 of FIG. 7) of memory device 700. As shown in FIG. 9, materials 871 through 879 and materials 881 through 890 are also formed over conductive contacts $740_8$, 728, 738, 748, and 758 (which are the same conductive contacts $740_8$, 728, 738, 748, and 758 in FIG. 7).

Figure 10:
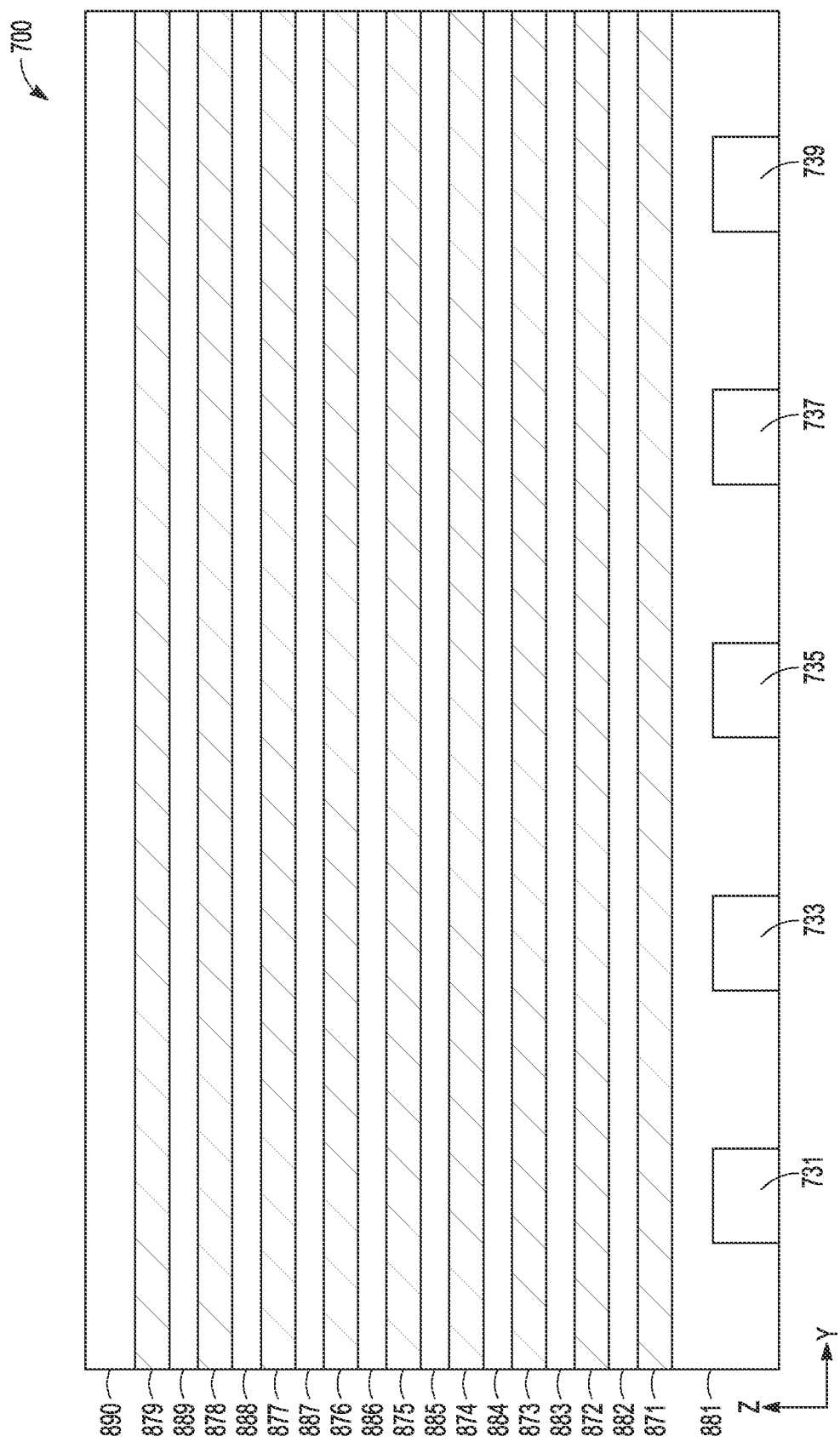

FIG. 10 also shows materials 871 through 879 and materials 881 through 890 at another a portion (e.g., a portion a cross section at line 793 of FIG. 7) of memory device 700. As shown in FIG. 10, materials 871 through 879 and materials 881 through 890 are also formed over conductive contacts 731, 733, 735, 737, and 739 (which are the same conductive contacts 731, 733, 735, 737, and 739 in FIG. 7).

In the following processes associated with FIG. 11 through FIG. 31, different portions of materials 871 through 879 and materials 881 through 890 can be removed (e.g., removed by using an etch process) in different steps (e.g., different etch process). Materials 871 through 879 and materials 881 through 890 under hard masks 701 through 712 (from the view in FIG. 7) are not removed (e.g., remain the same) when other portions (e.g., portions not under hard masks 701 through 712) of materials 871 through 879 and materials 881 through 890 are removed.

Figure 11:
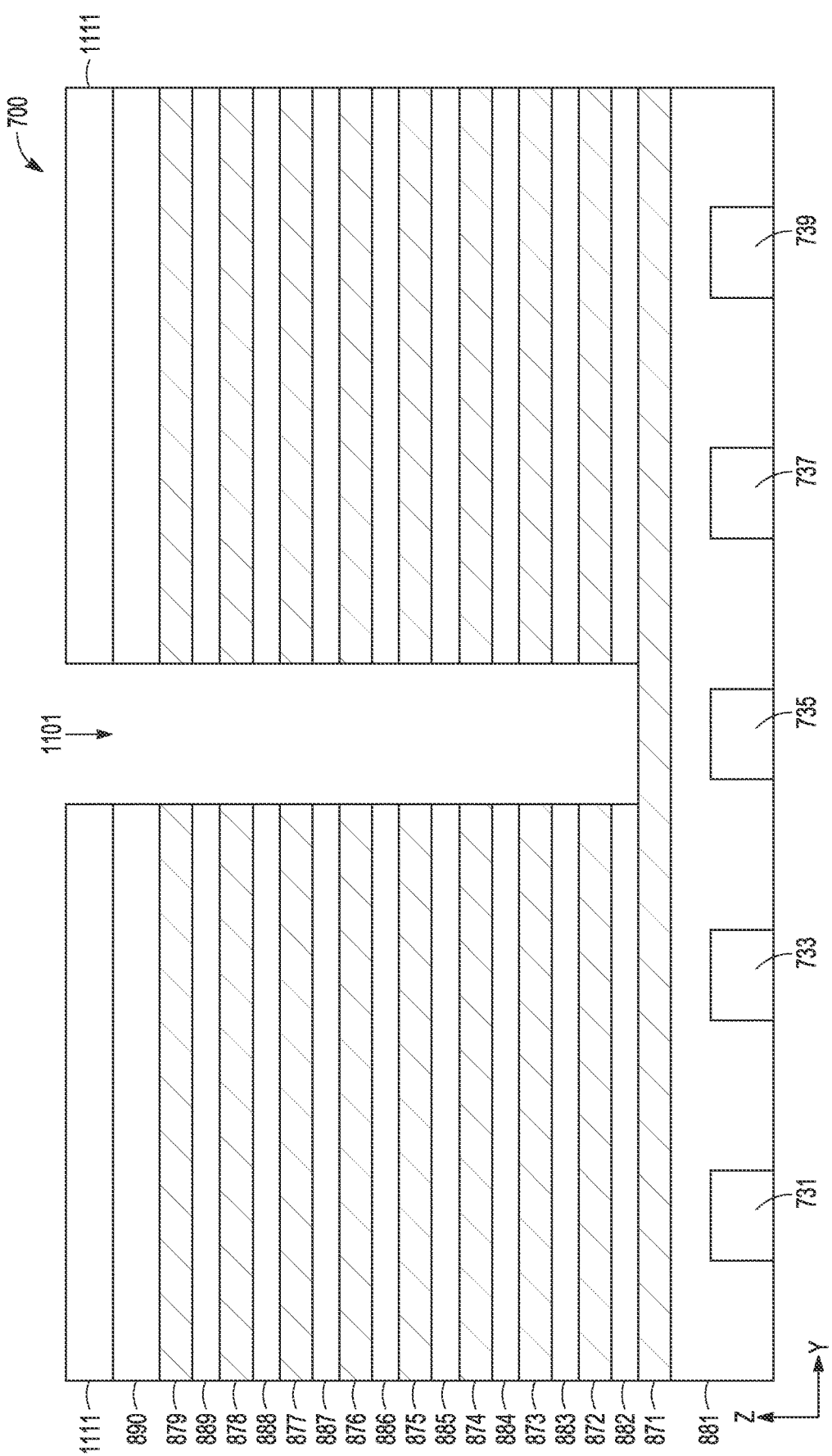

FIG. 11 shows a portion (e.g., a cross section at line 793 of FIG. 7) of memory device 700 including a remaining portion (e.g., a first remaining portion) of materials 872 through 879 and materials 882 through 890 after a portion of materials 872 through 879 and materials 882 through 890 at location 1101 is removed (e.g., removed by using an etch process). Material (e.g., silicon nitride) 871 is not removed in the process associated with FIG. 11. Thus, a remaining portion of material 871 in FIG. 11 is the same as material 871 in FIG. 10. In FIG. 11, the process of removing the portion of materials 872 through 879 and materials 882 through 890 at location 1101 can include using a resist structure 1111 having an opening at location 1101.

Figure 12:
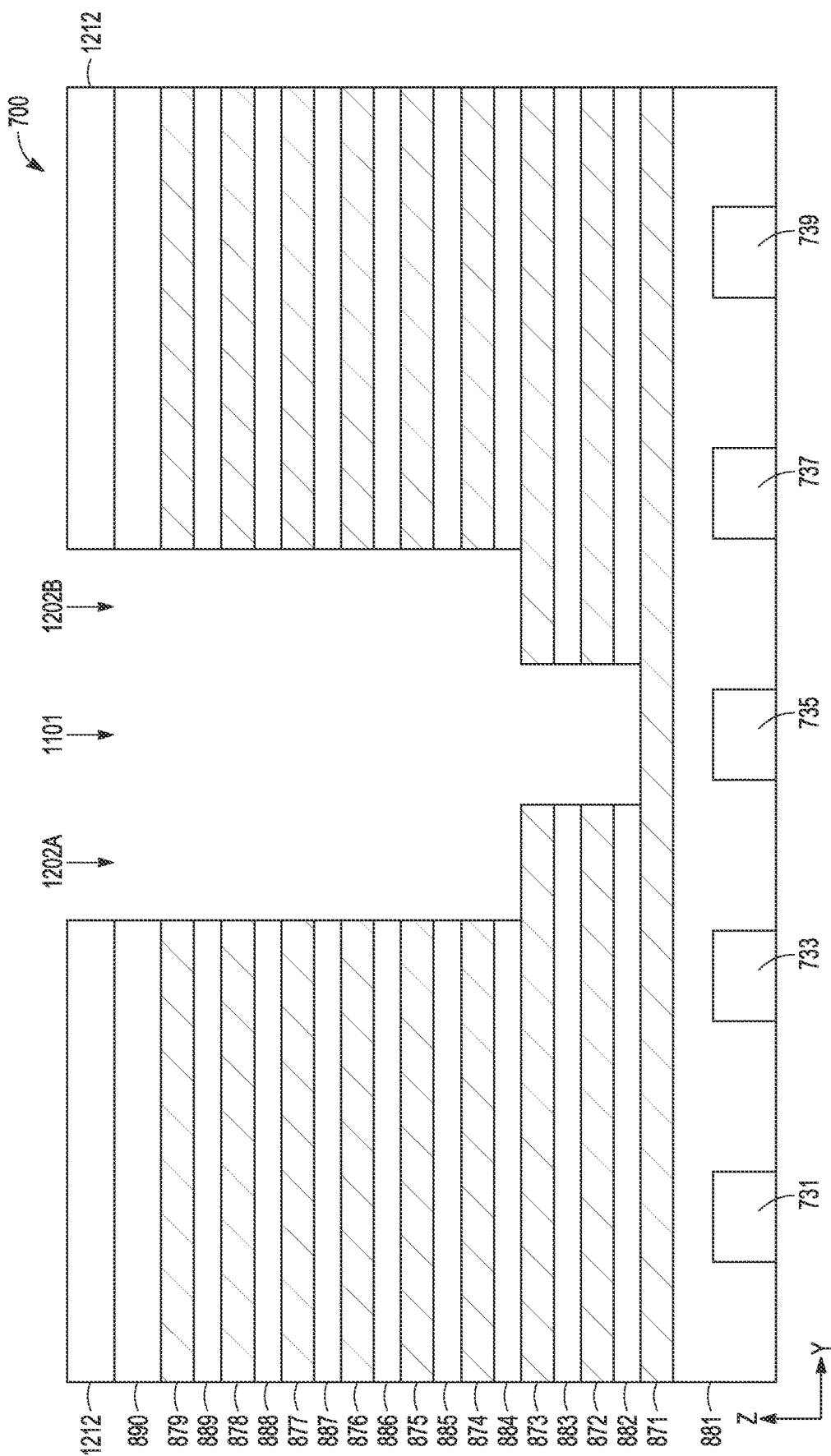

FIG. 12 shows a portion (e.g., a cross section at line 793 of FIG. 7) of memory device 700 including a remaining portion (e.g., a second remaining portion) of materials 872 through 879 and materials 882 through 890 after a portion of materials (e.g., silicon nitride) 874 and 875, and materials (e.g., silicon dioxide) 884 and 885 at each of locations 1202A and 1202B is removed (e.g., removed by using an etch process). The process of removing the portion of materials 872 through 879 and materials 882 through 890 at each of locations 1202A and 1202B can include using a resist structure 1212 having openings at locations 1101, 1202A, and 1202B. Resist structure 1212 can be formed by removing (e.g., trimming) a portion of resist structure 111 (FIG. 11) at locations 1202A and 1202B (FIG. 12).

Figure 13:
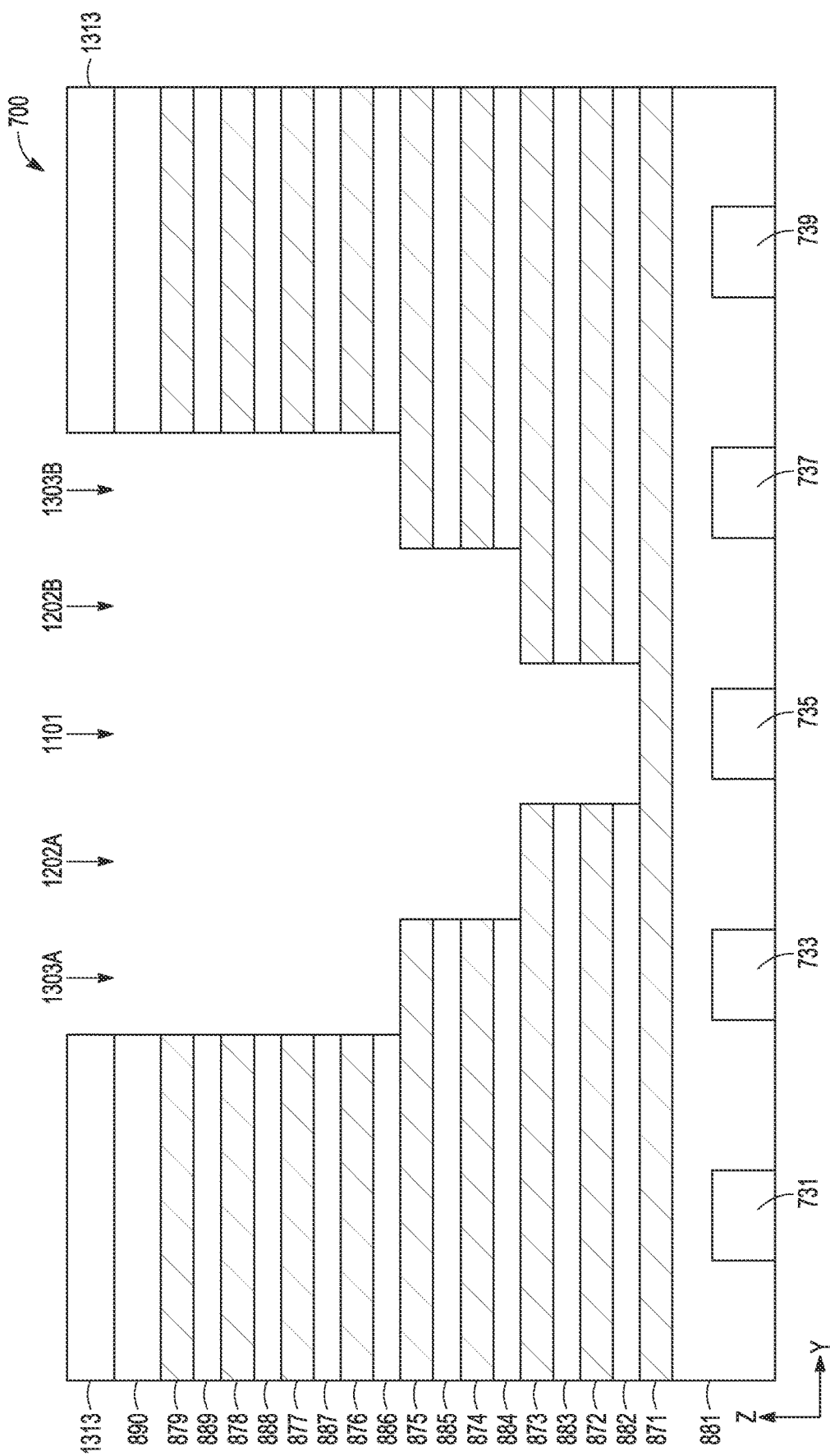

FIG. 13 shows a portion (e.g., a cross section at line 793 of FIG. 7) of memory device 700 including a remaining portion (e.g., a third remaining portion) of materials 872 through 879 and materials 882 through 890 after a portion of materials (e.g., silicon nitride) 876 and 877, and materials (e.g., silicon dioxide) 886 and 887 at each of locations 1303A and 1303B is removed (e.g., removed by using an etch process). The process of removing the portion of materials 872 through 879 and materials 882 through 890 at each of locations 1303A and 1303B can include using a resist structure 1313 having openings at locations 1101, 1202, and 1303A, and 1303B. Resist structure 1313 can be formed by removing (e.g., trimming) a portion of resist structure 1212 (FIG. 12) at locations 1303A and 1303B (FIG. 13).

Figure 14:
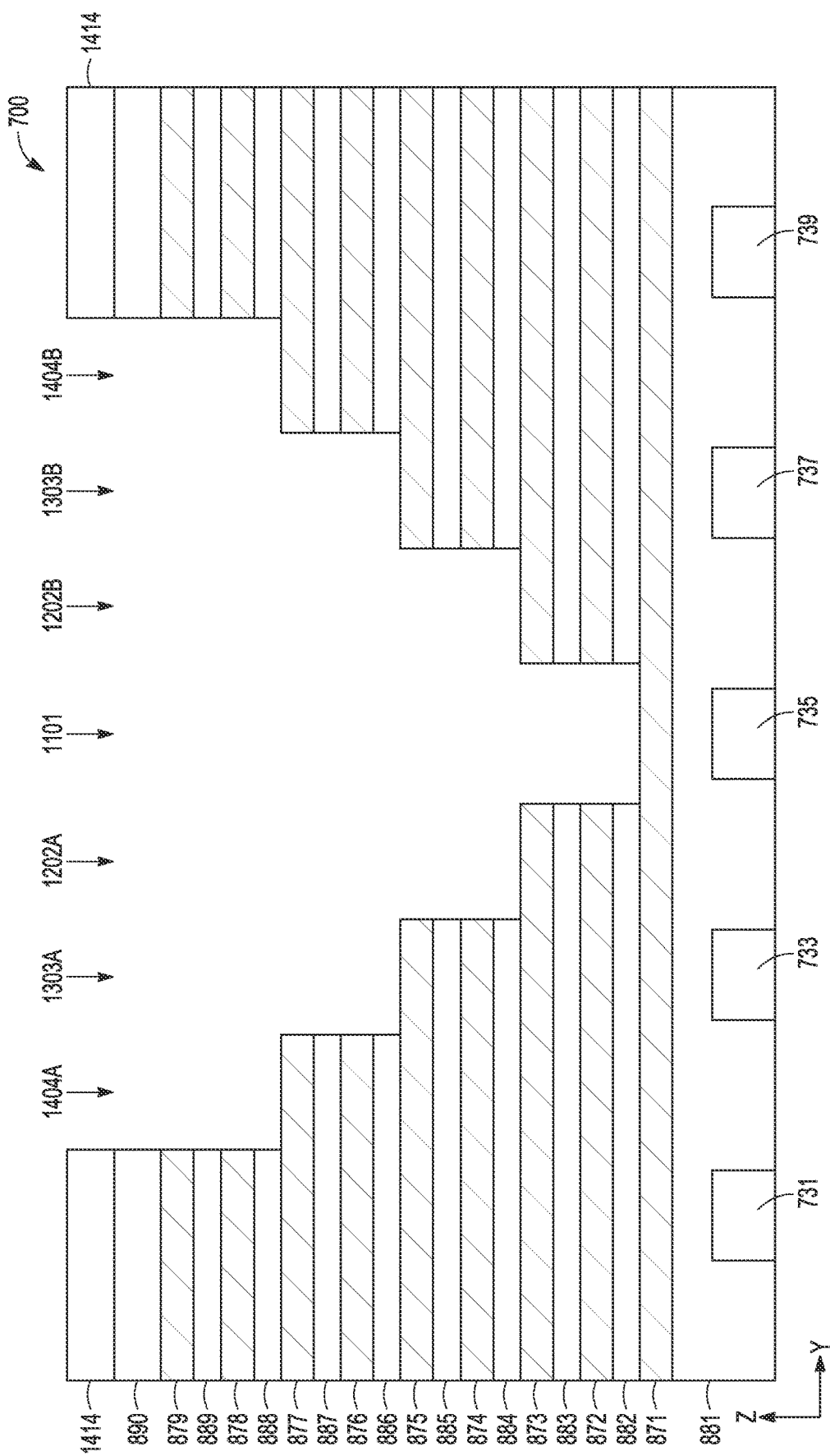

FIG. 14 shows a portion (e.g., a cross section at line 793 of FIG. 7) of memory device 700 including a remaining portion (e.g., a fourth remaining portion) of materials 872 through 879 and materials 882 through 890 after a portion of materials (e.g., silicon nitride) 878 and 879, and materials (e.g., silicon dioxide) 888, 889, and 890 at each of locations 1404A and 1404B is removed (e.g., removed by using an etch process). The process of removing the portion of materials 872 through 879 and materials 882 through 890 at each of locations 1404A and 1404B can include using a resist structure 1414 having openings at locations 1101, 1202, 1303A and 1303B, and 1404A and 1404B. Resist structure 1414 can be formed by removing (e.g., trimming) a portion of resist structure 1313 (FIG. 13) at locations 1404A and 1404B (FIG. 14).

Figure 15:
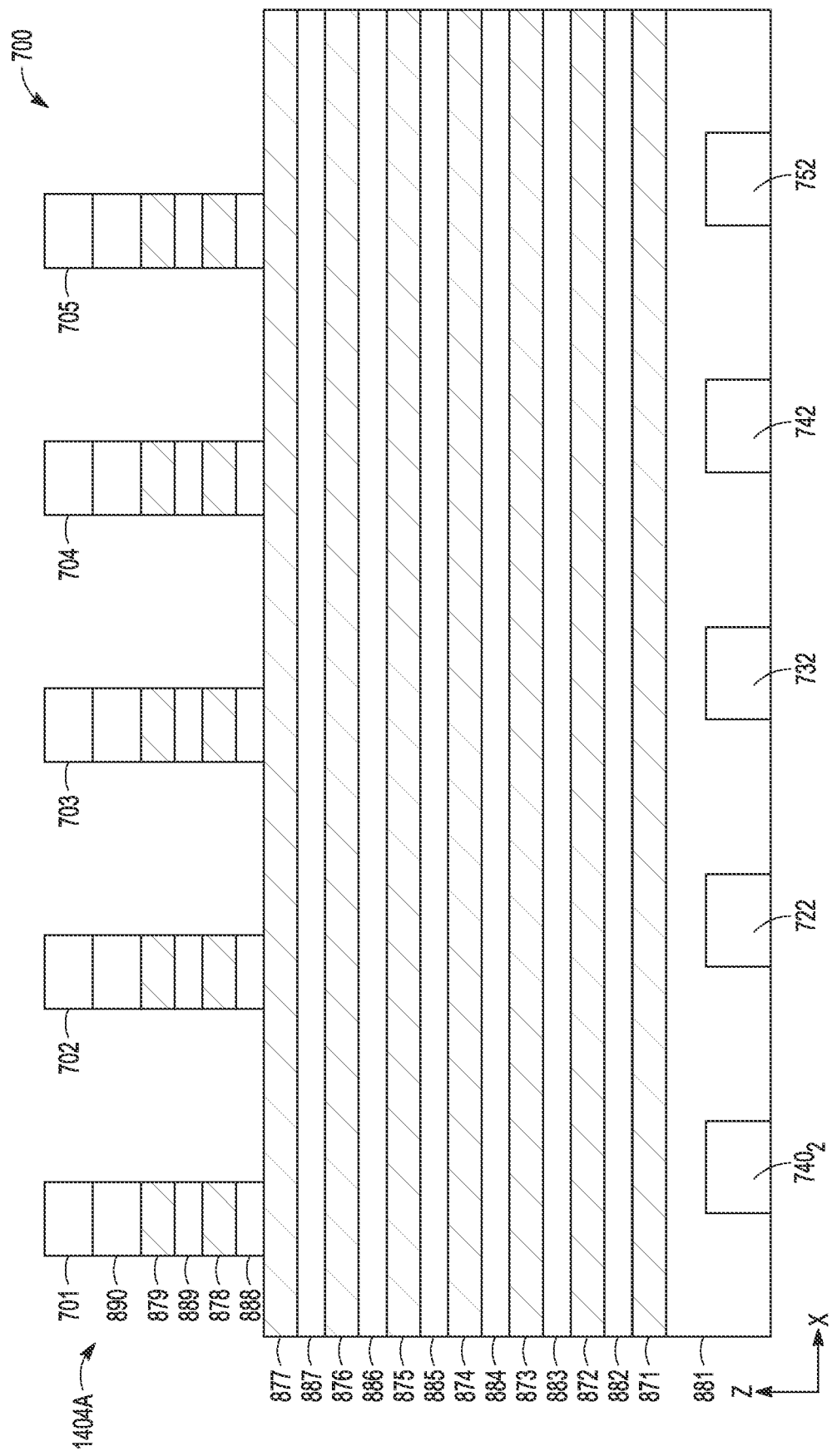

FIG. 15 shows another portion (e.g., a cross section at line 791 of FIG. 7) of memory device 700 including a different view of the remaining portion (e.g., a fourth remaining portion) of materials 872 through 879 and materials 882 through 890 location 1404A. Location 1404A in FIG. 15 is the same as location 1404A in FIG. 14. However, location 1404A in FIG. 15 is relative to the X-Z directions (e.g., from a cross section along line 791 in FIG. 7), and location 1404A in FIG. 14 is relative to the Y-Z directions (e.g., relative to a cross section along line 793 in FIG. 7). As shown in FIG. 15, the portion of materials 871 through 879 and materials 881 through 890 under hard masks (e.g., hard masks 701 through 705) was not removed in the processes up to the in the process associated with FIG. 14. However, as shown in FIG. 15, the portion of materials 878 and 879, and materials 888, 889, and 890 at location 1404A and not under the hard masks (e.g., hard masks 701 through 705) was removed (in the process associated with FIG. 14).

Figure 16:
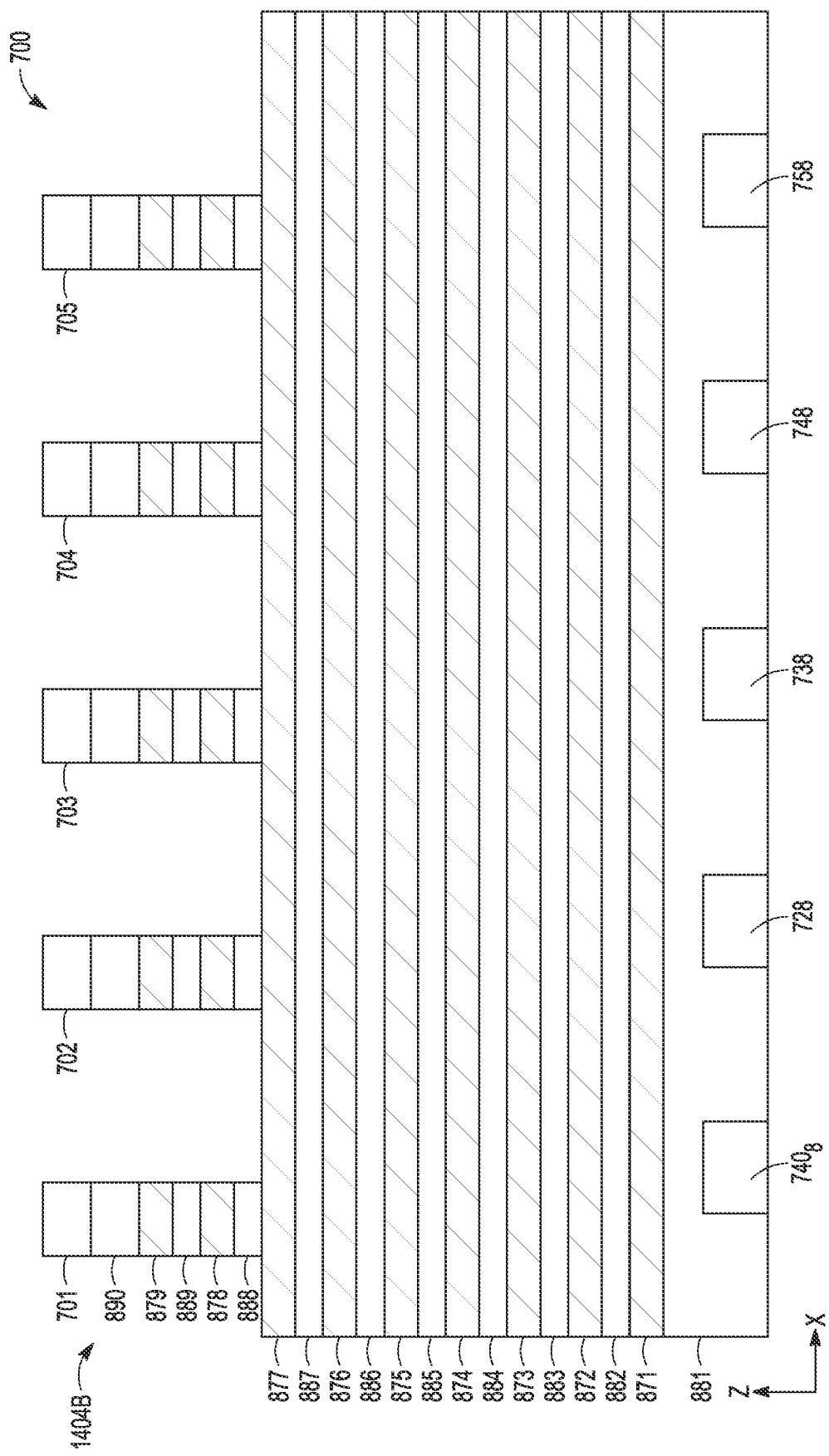

FIG. 16 shows another portion (e.g., a cross section at line 792 of FIG. 7) of memory device 70 including a different view of the remaining portion (e.g., a fourth remaining portion) of materials 872 through 879 and materials 882 through 890 location 1404B. Location 1404B in FIG. 16 is the same as location 1404B in FIG. 14. However, location 1404B in FIG. 16 is relative to the X-Z directions (e.g., from a cross section along line 792 in FIG. 7), and location 1404B in FIG. 14 is relative to the Y-Z directions (e.g., relative to a cross section along line 793 in FIG. 7). As shown in FIG. 16, the portion of materials 871 through 879 and materials 881 through 890 under hard masks (e.g., hard masks 701 through 705) was not removed in the processes up to the in the process associated with FIG. 14. However, as shown in FIG. 16, the portion of materials 878 and 879, and materials 888, 889, and 890 at location 1404B and not under the hard masks (e.g., hard masks 701 through 705) was removed (in the process associated with FIG. 14).

Figure 17:
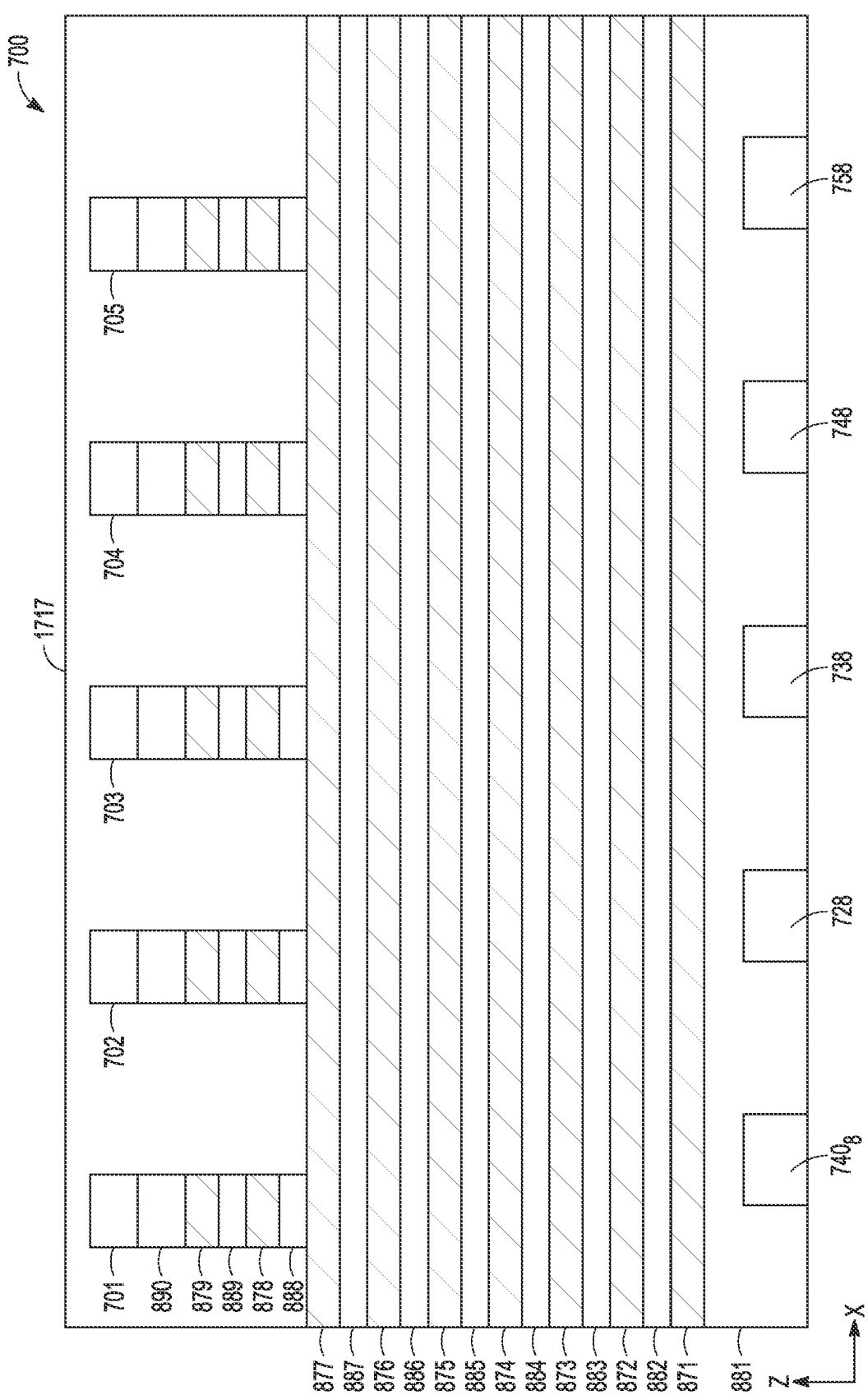
Figure 18:
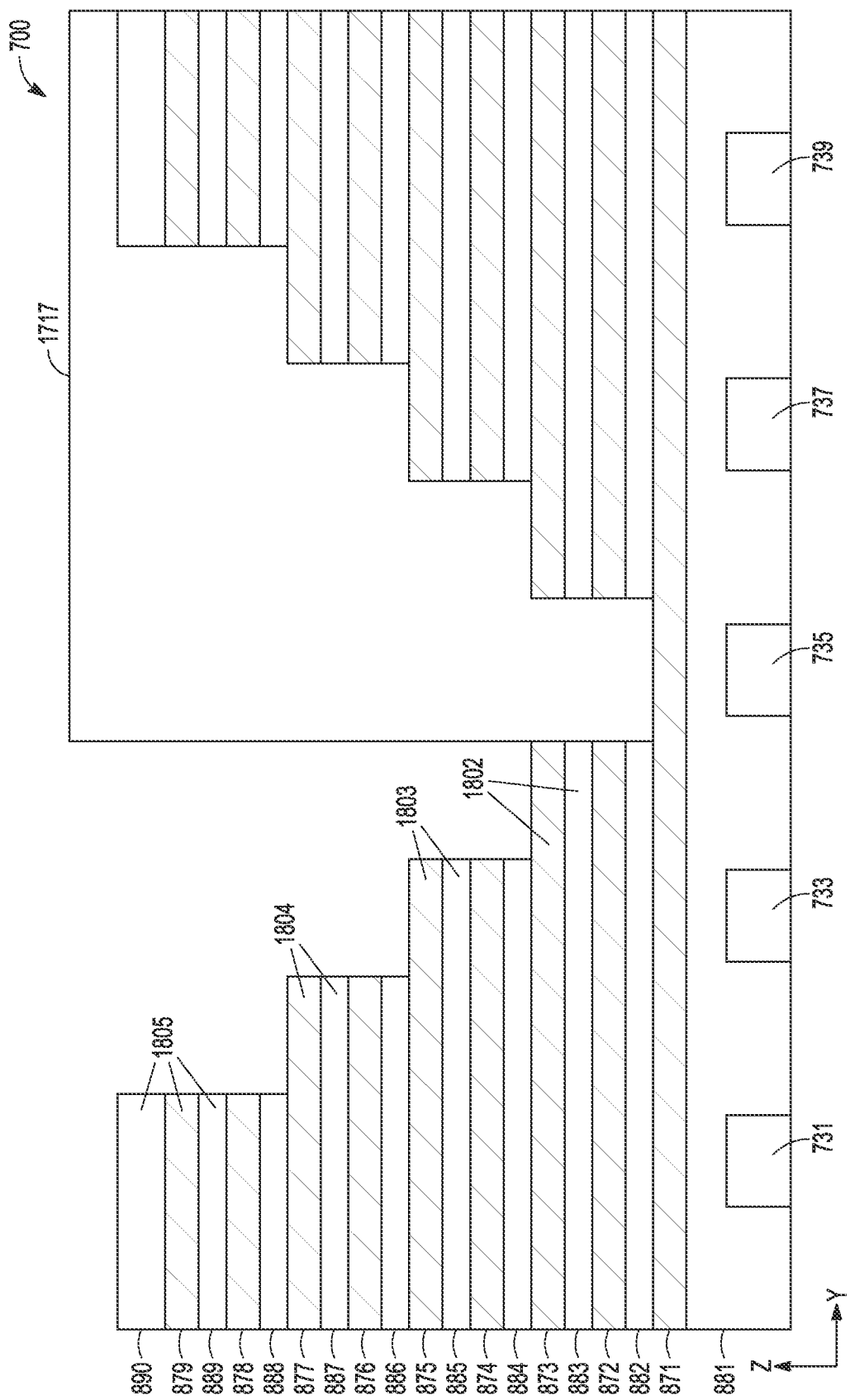

FIG. 17 and FIG. 18 show different views of portions (e.g., cross sections at lines 792 and 793, respectively, of FIG. 7) of memory device 700 after a resist structure 1717 is formed. As shown in FIG. 17, resist structure 1717 can be formed over the hard masks (e.g., hard masks 701 through 705) of memory device 700. In FIG. 18, resist structure 1717 can be formed over the portion of memory device 700 from the location of conductive contact 735 to the rest of memory device 700 in the Y-direction relative to the direction from conductive contact 735 to conductive contact 737. As described above with reference to FIG. 7, resist structure 1717 can be formed at location 717 to cover the materials in a portion (e.g., the portion at location 717) of memory device 700. In FIG. 17 and FIG. 18, the portion of memory device 700 under resist structure 1717 is part of the portion of memory device 700 at location 717 in FIG. 7. In FIG. 18, portions 1802, 1803, 1804, and 1805 (which are not cover by resist structure 1717) will be removed in the process associated with FIG. 19. As shown in FIG. 18, each of portions 1802, 1803, 1804, and 1805 can include one of material among materials 873 through 879 and one of material among materials 883 through 889. Portion 1805 can include part of the remaining portion of material 890.

Figure 19:
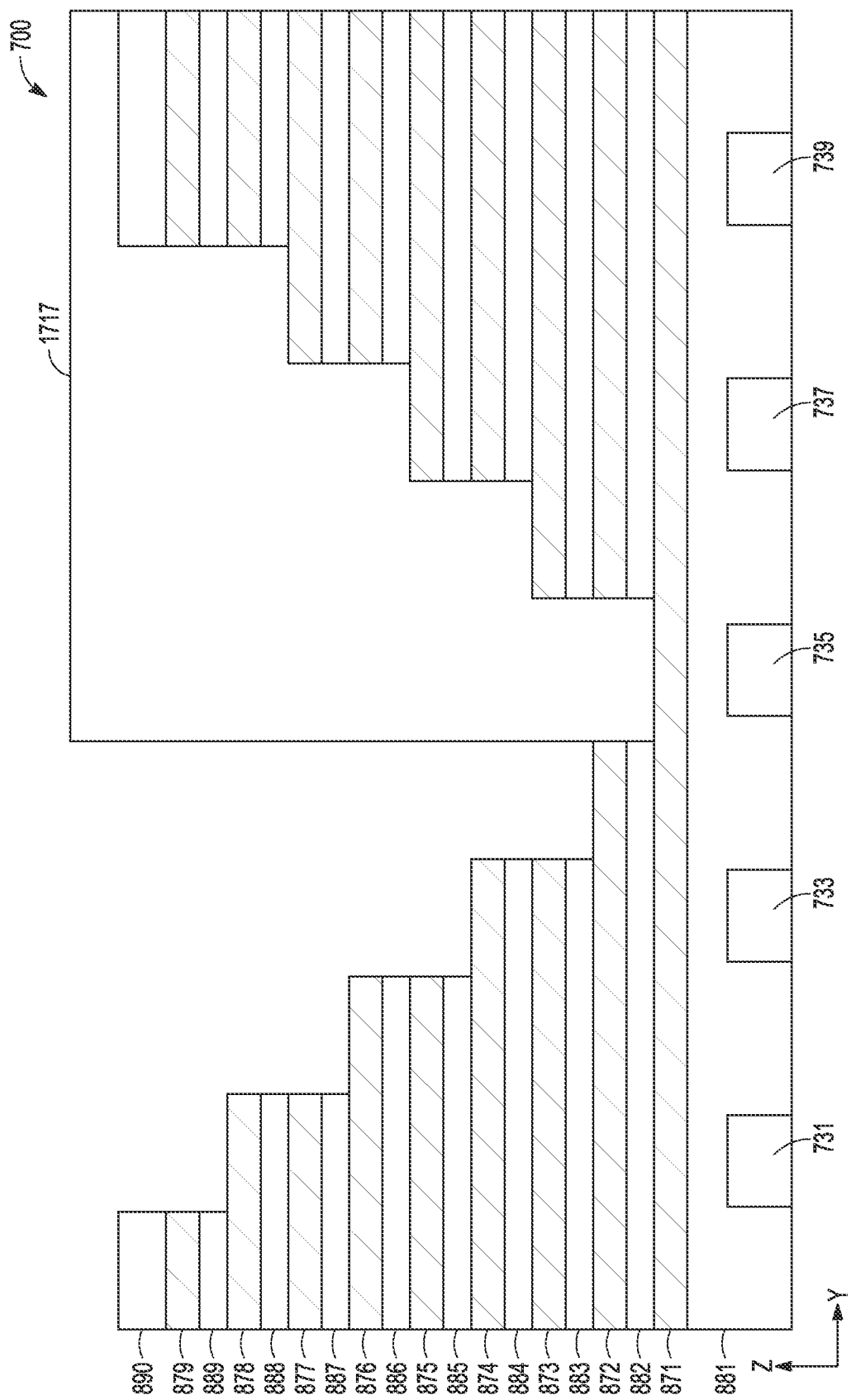

FIG. 19 shows the portion of memory device 700 of FIG. 18 including a remaining portion (e.g., a fifth remaining portion) of materials 872 through 879 and materials 882 through 890 after portions 1802, 1803, 1804, and 1805 (FIG. 18) are removed (e.g., removed by using an etch process).

Figure 20:
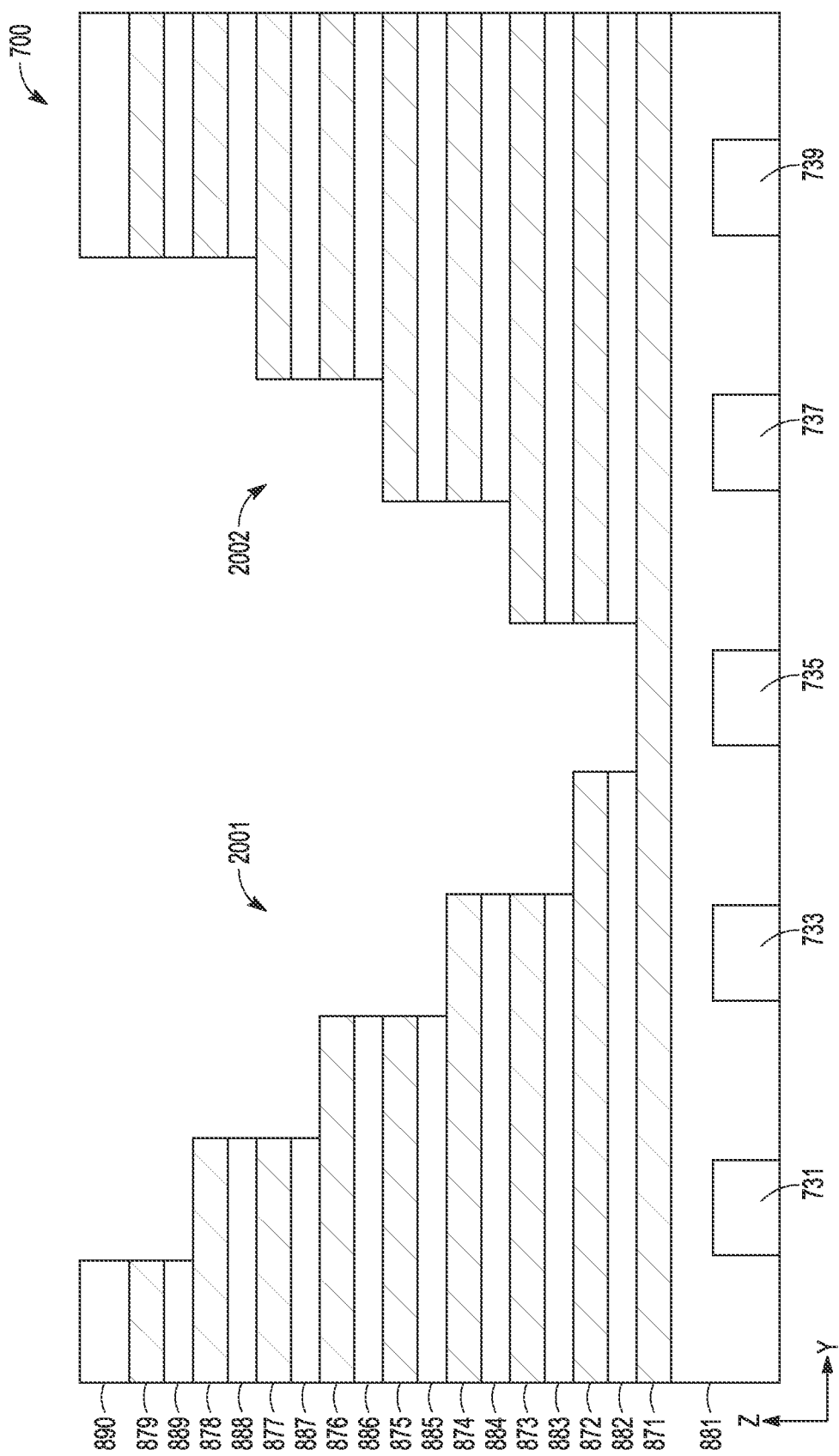
Figure 21:
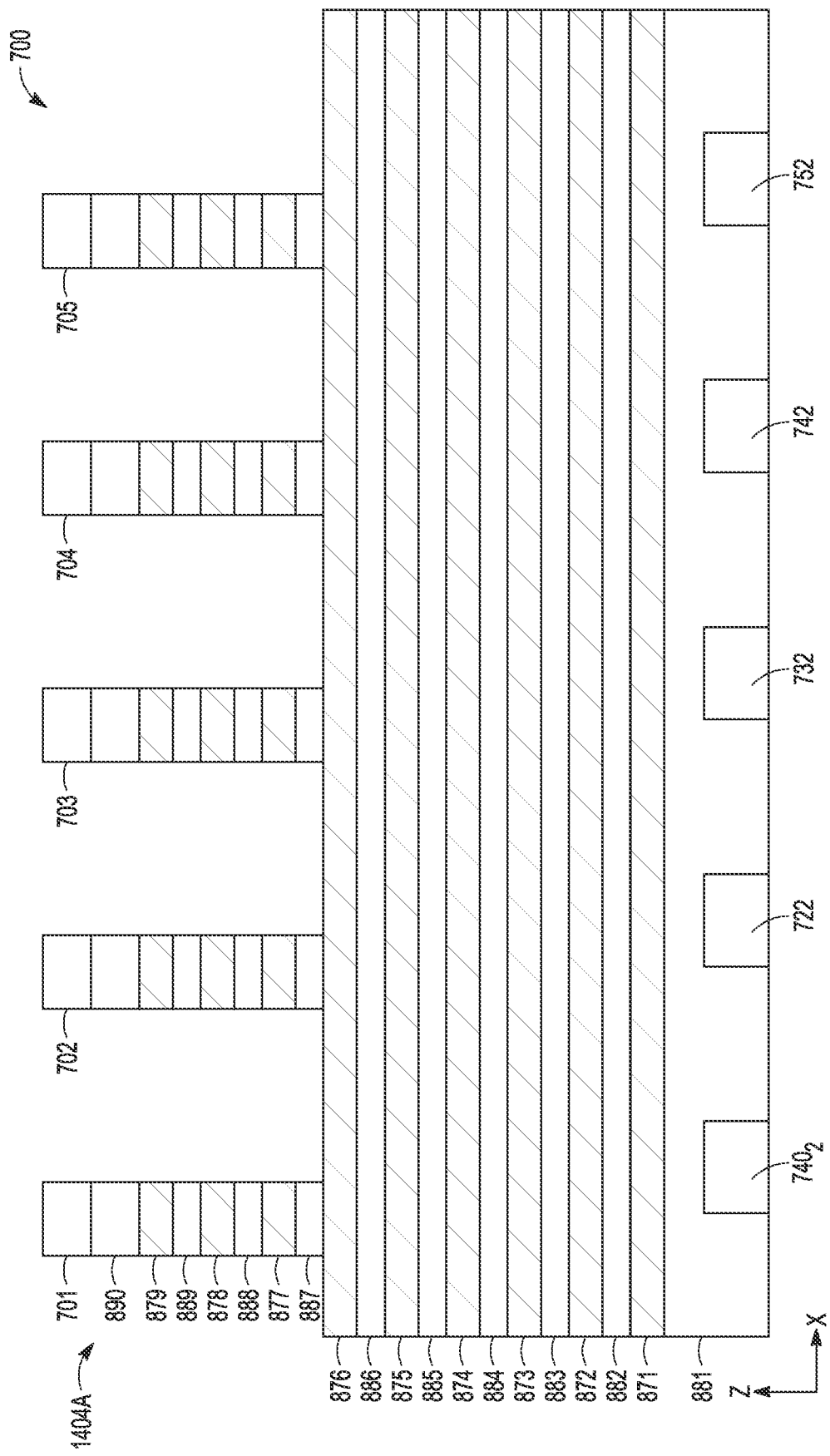

FIG. 20 and FIG. 21 show different views of portions (e.g., cross sections at lines 793 and 791, respectively, of FIG. 7) of memory device 700 after portions 1802, 1803, 1804, and 1805 (FIG. 18) are removed (in the process associated with FIG. 19). As shown in FIG. 20, the process associated with FIG. 19 can form staircase structures 2001 and 2002 that are opposite from each other (e.g., the stairs of staircase structure 2001 are facing the stairs of staircase structure 2002 in the Y-direction). The stairs of staircase structure 2001 are at uneven levels with the stairs of staircase structure 2001, such that the top exposed portions (e.g., top of the stairs) of staircase structure 2001 of the remaining portions of materials 872, 874, 876, and 878 are at uneven levels with the top exposed portions (e.g., top of the stairs) of staircase structure 2002 of the remaining portions of materials 871, 873, and 875.

Figure 22:
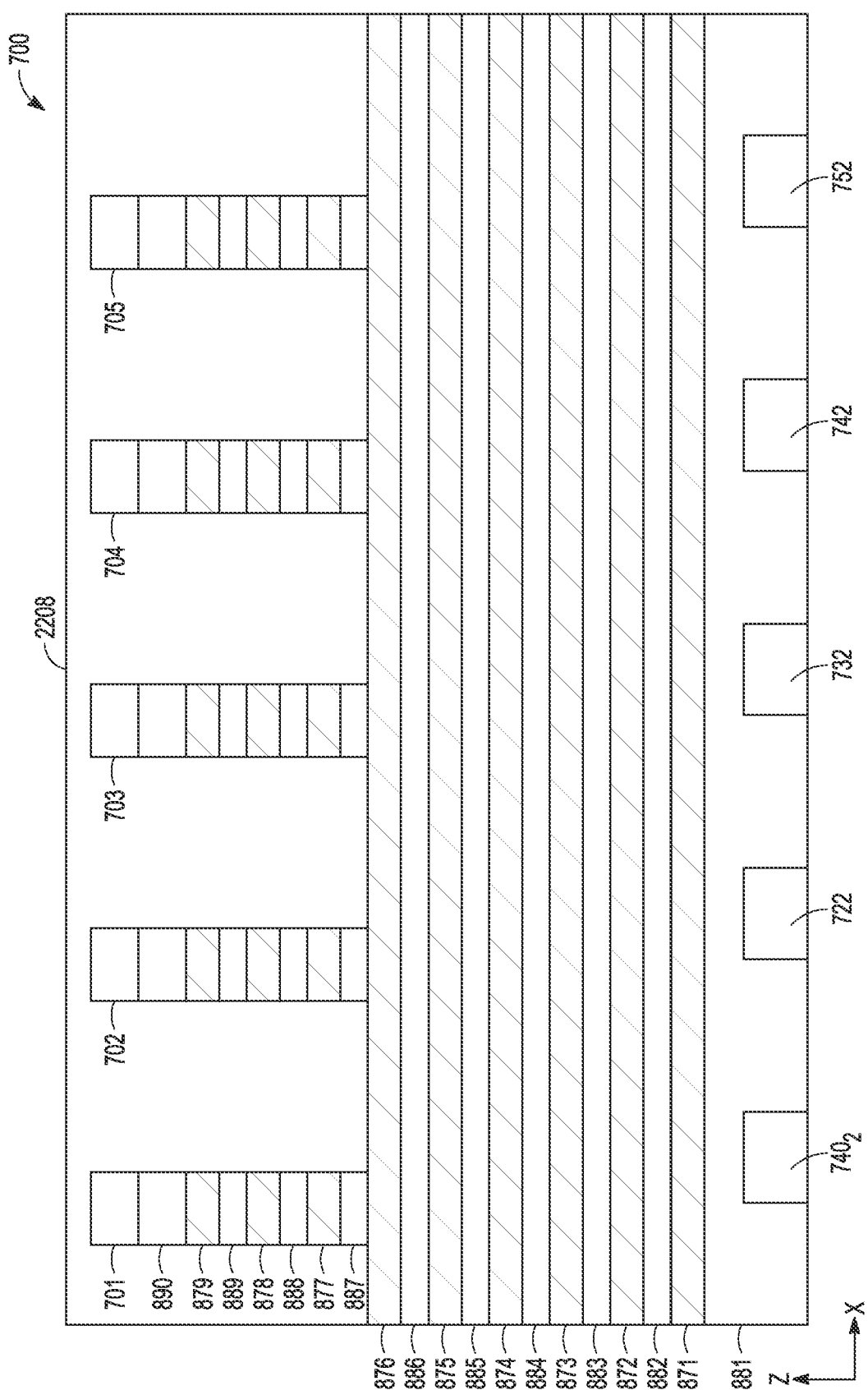

FIG. 22 shows a portion (e.g., a cross section at line 791 of FIG. 7) of memory device 700 after a material (e.g., dielectric material) 2208 is formed. Material 2208 can include silicon dioxide. Forming material 2208 can include depositing an initial material (e.g., silicon dioxide) over hard masks 701 through 705 and other materials of memory device 700 shown in FIG. 22. In the view of FIG. 20, initial material can also be deposited (filled) the space at the staircase structure of materials 871 through 879 and materials 881 through 890. After depositing (filling) the initial material, a material removal process (e.g., chemical mechanical planarization (CMP) process) can be used to remove a portion (e.g., a top portion) of the initial material and stop at hard masks 701 through 705 (e.g., stop at the top of hard masks 701 through 705). Thus, hard masks 701 through 705 can be used as stoppers (e.g., a stop layer) in the material removal process. The remaining portion of the initial material (after its top portion is removed) is material 2208 shown in FIG. 22 and FIG. 23.

Figure 23:
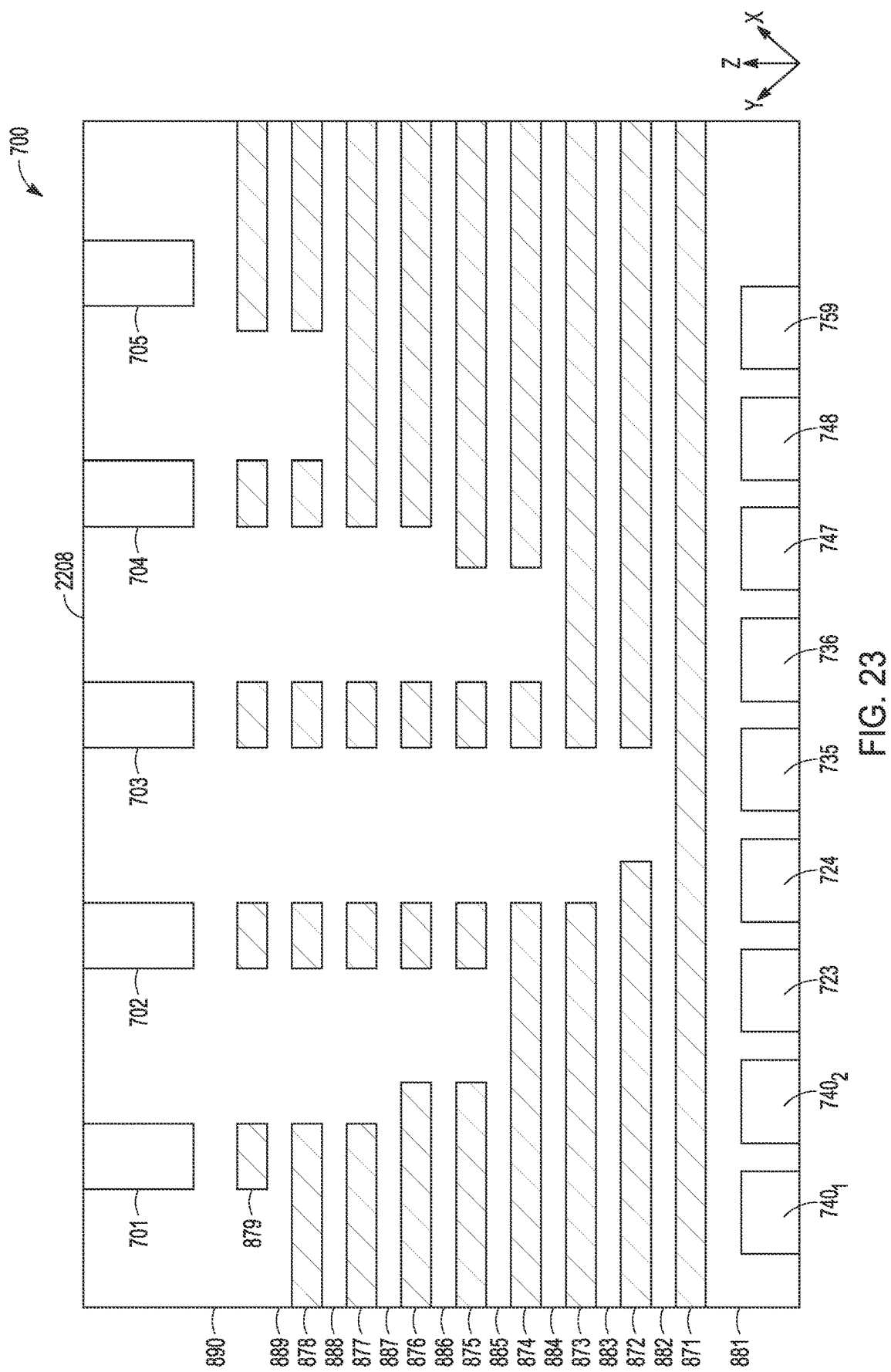

FIG. 23 shows a portion (e.g., a cross section at line 794 of FIG. 7) of memory device 700 including a different view material 2208 shown in FIG. 22. As shown in FIG. 7, line 794 can be at an angle (e.g., extending diagonally) relative to the X and Y directions, such that the view of memory device 700 can include conductive contacts $740_1$, $740_2$, 723, 724, 735, 736, 747, 748, and 759.

Figure 24:
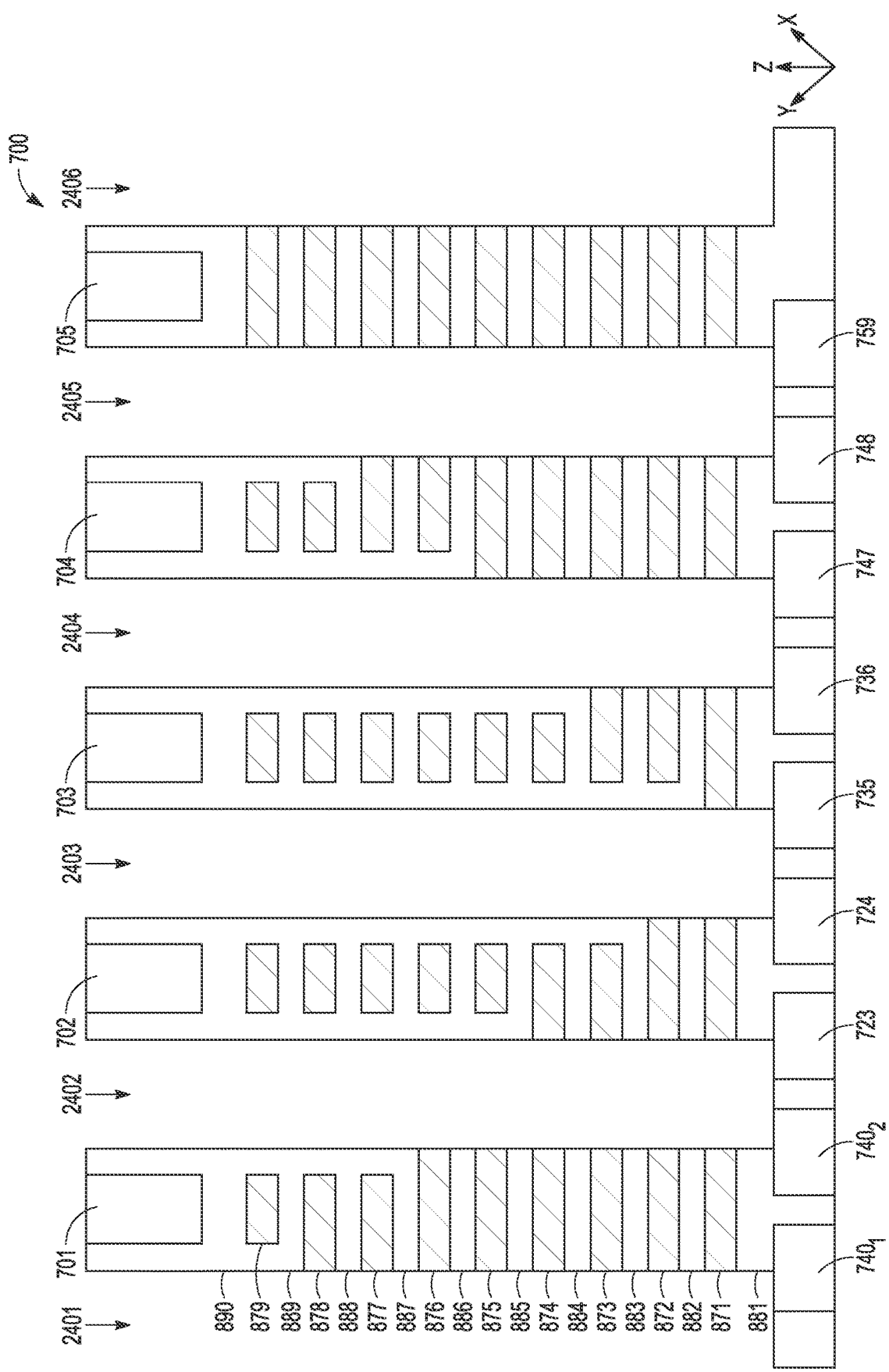

FIG. 24 shows a portion of memory device 700 after openings (e.g., trenches) 2401, 2402, 2403, 2404, 2405, and 2406 are formed. Forming openings 2401, 2402, 2403, 2404, 2405, and 2406 can include removing (e.g., removed by using an etch process) a portion of material (e.g., silicon oxide) 2208, materials 871 through 879, and materials 881 through 890 at the locations of openings 2401, 2402, 2403, 2404, 2405, and 2406 down to (e.g., down to the top of) each of conductive contacts $740_1$, $740_2$, 723, 724, 735, 736, 747, 748, and 759. Thus, the process associated with FIG. 24 can include exposing a portion of each of conductive contacts $740_1$, $740_2$, 723, 724, 735, 736, 747, 748, and 759 at respective openings 2401, 2402, 2403, 2404, 2405, and 2406.

Figure 25:
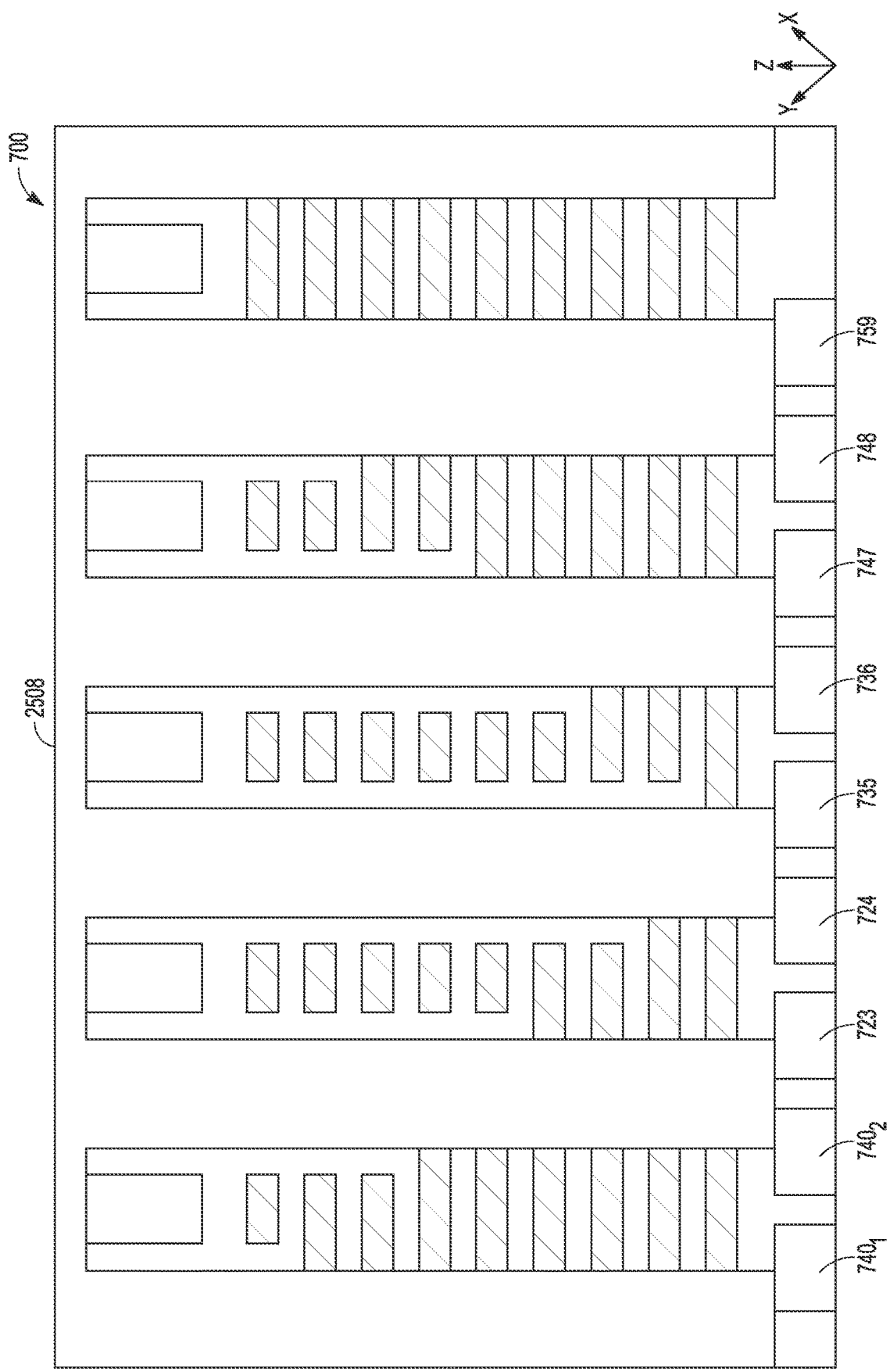

FIG. 25 shows a portion of memory device 700 after a material (e.g., dielectric material) 2508 is formed. Material 2508 can include silicon dioxide. Forming material 2508 can include depositing (e.g., filling) a material (e.g., silicon dioxide) in openings 2401, 2402, 2403, 2404, 2405, and 2406. Material 2508 can also be formed over hard masks 701 through 705.

Figure 26:
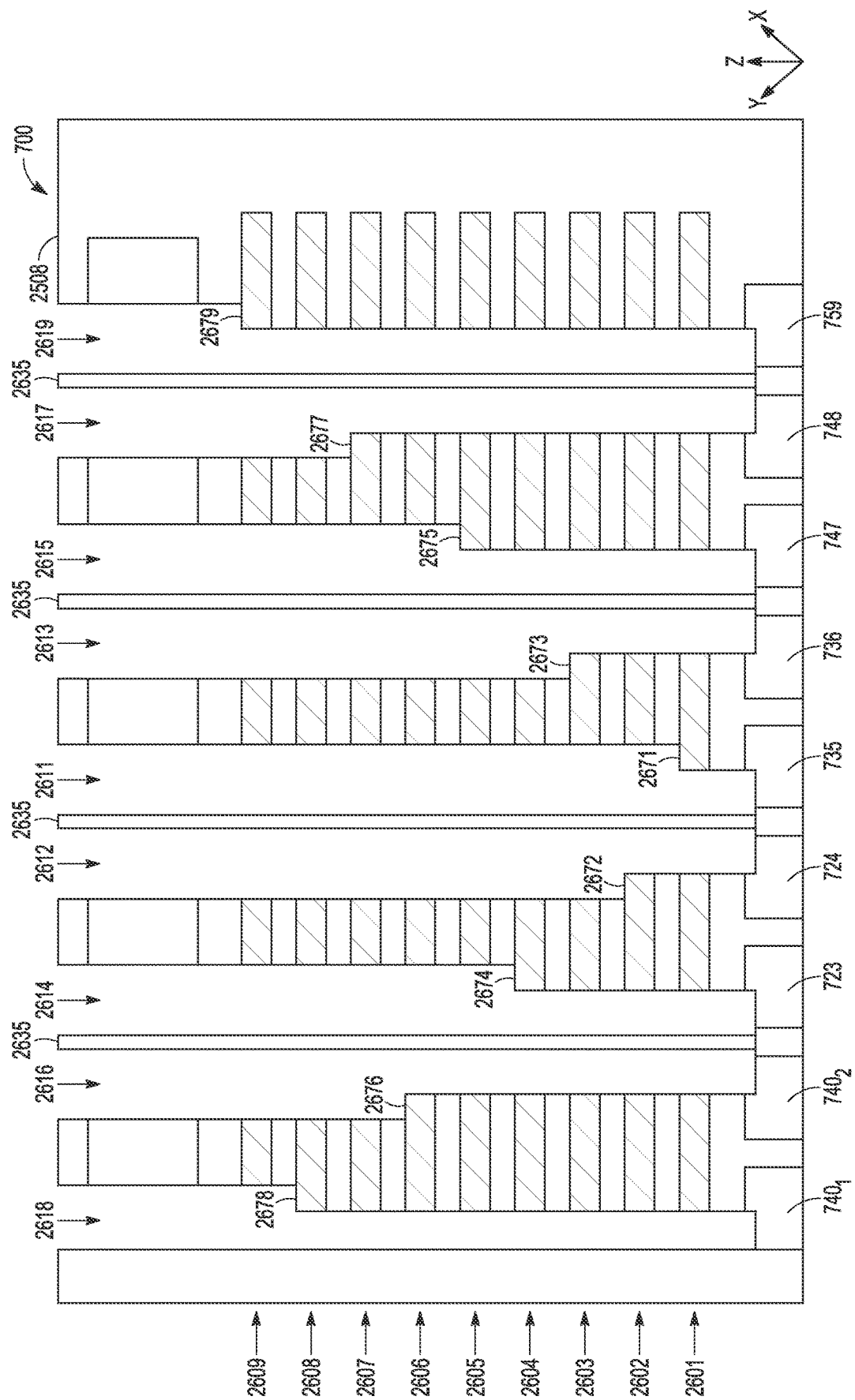

FIG. 26 shows a portion of memory device 700 after openings (e.g., contact openings) 2611 through 2619 are formed. Forming openings 2611 through 2619 can include removing (e.g., removed by using an etch process) a portion of materials (e.g., silicon oxide) 2208 and 2508 at the locations of openings 2611 through 2619 down to (e.g., down to the top of) each of conductive contacts $740_1$, $740_2$, 723, 724, 735, 736, 747, 748, and 759. Thus, the process associated with FIG. 26 can include exposing a portion of each of conductive contacts $740_1$, $740_2$, 723, 724, 735, 736, 747, 748, and 759 at respective openings 2611, 2612, 2613, 2614, and 2615.

The process associated with the FIG. 26 can include a selective etch process such that materials 881 through 889 located at levels 2601 through 2609 at the locations of openings 2611 through 2619 are not removed. Thus, the process associated with FIG. 26 can include exposing portions (e.g., landing pads) 2671 through 2679 of materials 881 through 889, respectively, at the locations of openings 2611 through 2619, respectively.

The process associated with the FIG. 26 can include forming isolation structures 2635, such that one of isolation structures 2635 can be between two adjacent conductive contacts among conductive contacts $740_1$, $740_2$, 723, 724, 735, 736, 747, 748, and 759.

Figure 27:
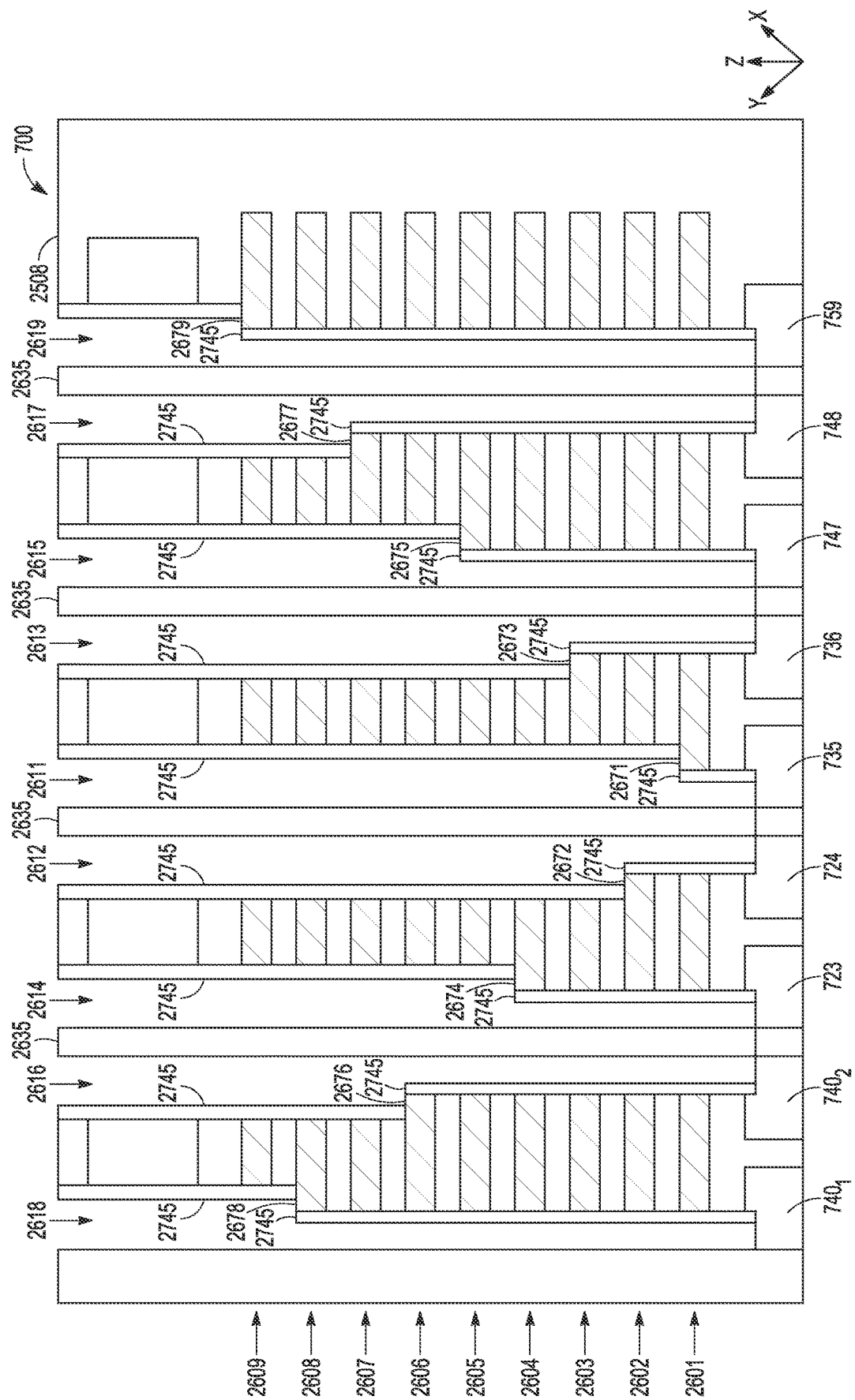

FIG. 27 shows a portion of memory device 700 after spacers (e.g., vertical dielectric spacers) 2745 are formed in on side walls of respective openings 2611 through 2619. Forming spacers 2745 can include depositing a dielectric material (e.g., silicon dioxide) in openings 2611 through 2619 and then removing (e.g., removed by using an etch process) a portion of the dielectric material. The remaining portion of the dielectric material form spacers 2745 shown in FIG. 27. Some of the remaining portion of the dielectric material may also be formed on (e.g., formed on sidewalls) of each of isolation structures 2635. For simplicity, FIG. 27 omits labels for the dielectric material formed on isolation structures 2635. As described in subsequent processes (e.g., associated with FIG. 30) spacers 2745 can form dielectric structures that electrically separate a respective conductive structure from a respective stack of data lines. For example, spacers 2745 can correspond to spacers (e.g., vertical dielectric spacers) 345 of FIG. 5 that electrically separate a respective conductive structure among conductive structures $314_1$, $314_3$, $314_5$, $314_7$, and $314_9$ (FIG. 5) from a respective stack of data lines among data lines $170_1$ through $170_9$ (FIG. 5).

Figure 28:
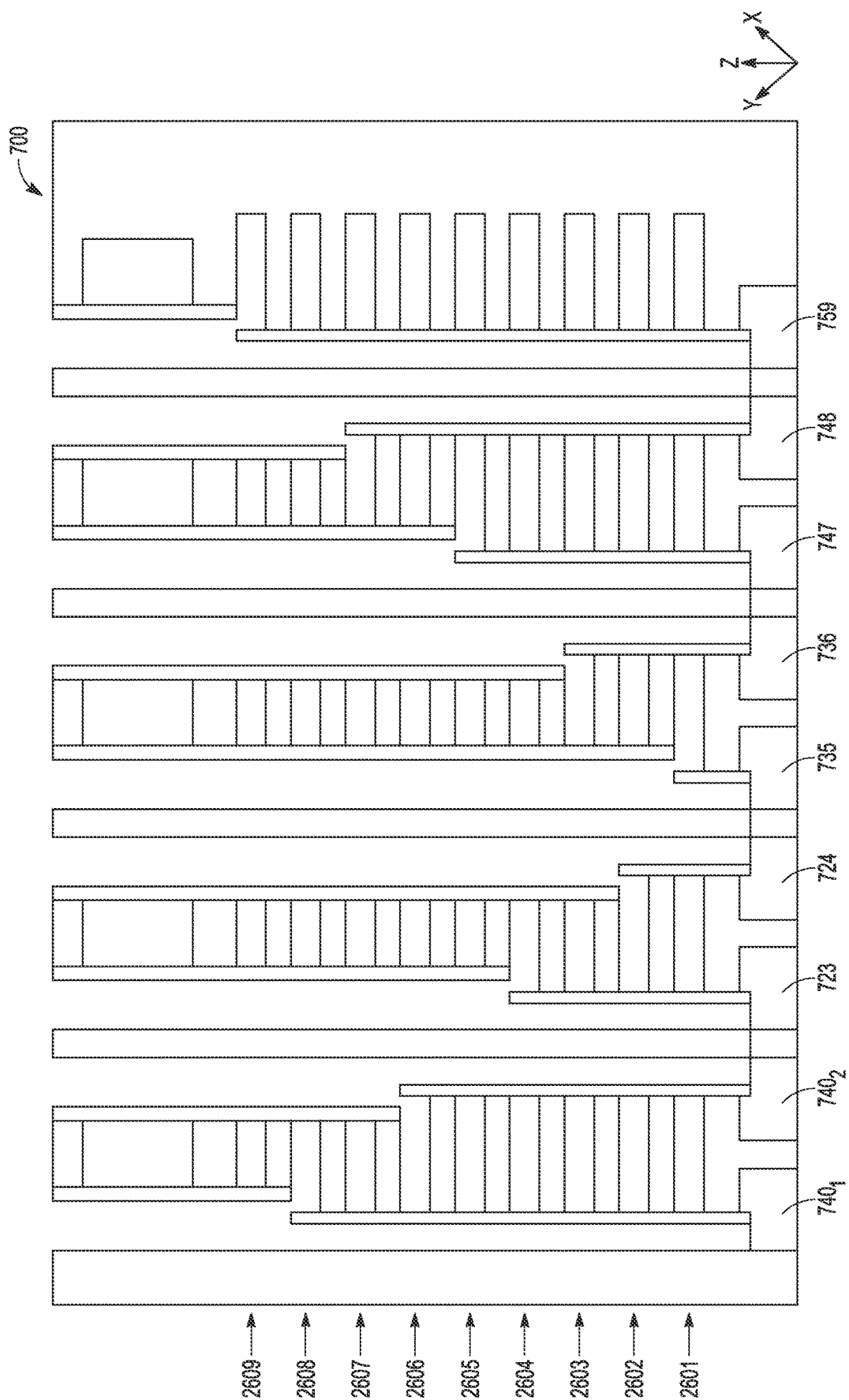

FIG. 28 shows a portion of memory device 700 after materials 871 through 879 are removed (e.g., exhumed). Thus, the process associated with FIG. 27 can include forming empty spaces at the locations that were occupied by materials 871 through 879.

Figure 29:
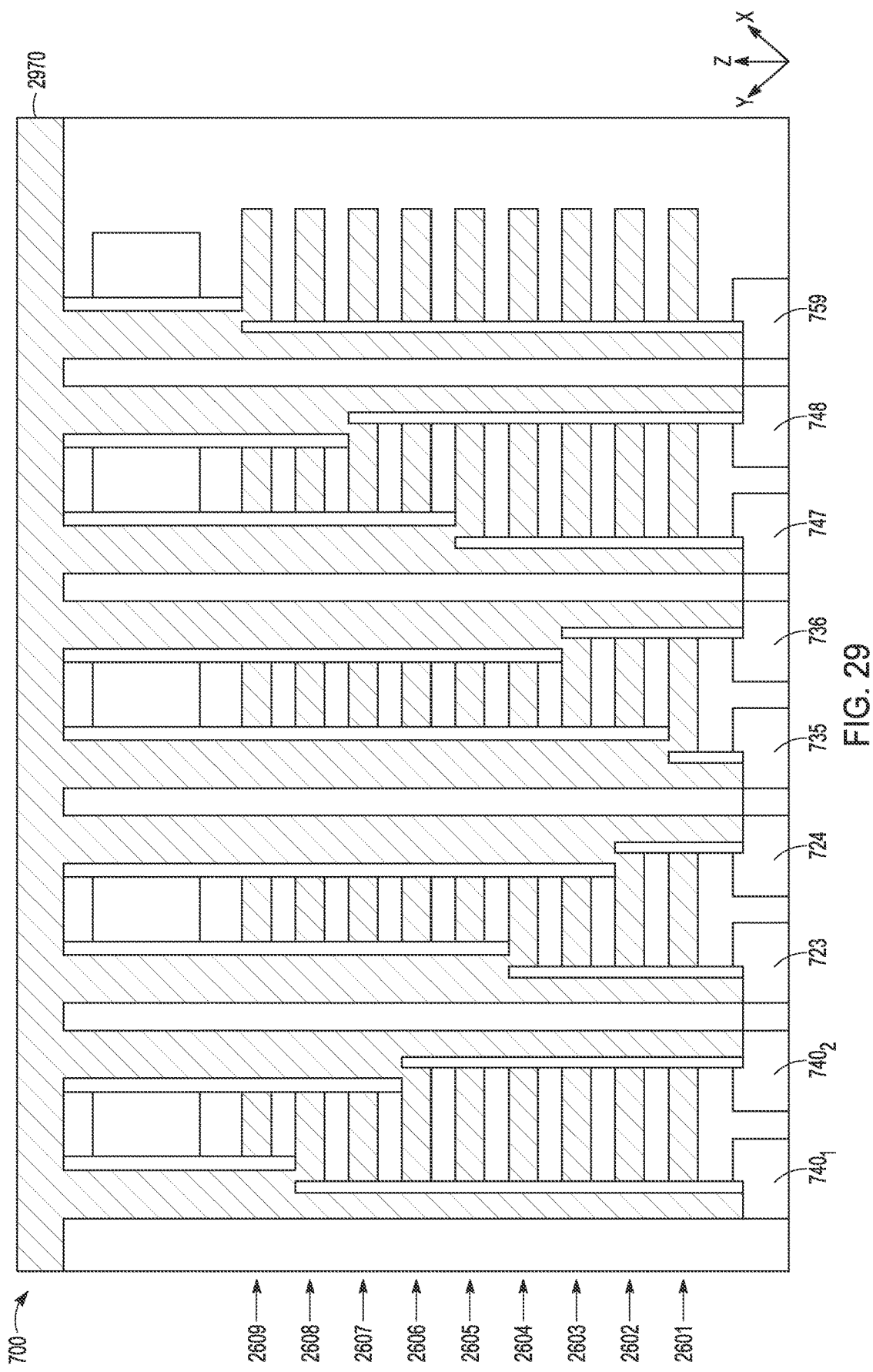

FIG. 29 shows a portion of memory device 700 after a conductive material 2970 is formed. Conductive material 2970 can include metal, conductively doped polysilicon, or other conductive materials. As an example, conductive material 2970 can include tungsten or a combination of tungsten and nitride. Forming conductive material 2970 can include depositing conductive material 2970 in openings 2611 through 2619 and in the empty spaces at the locations that were occupied by materials 871 through 879.

Figure 30:
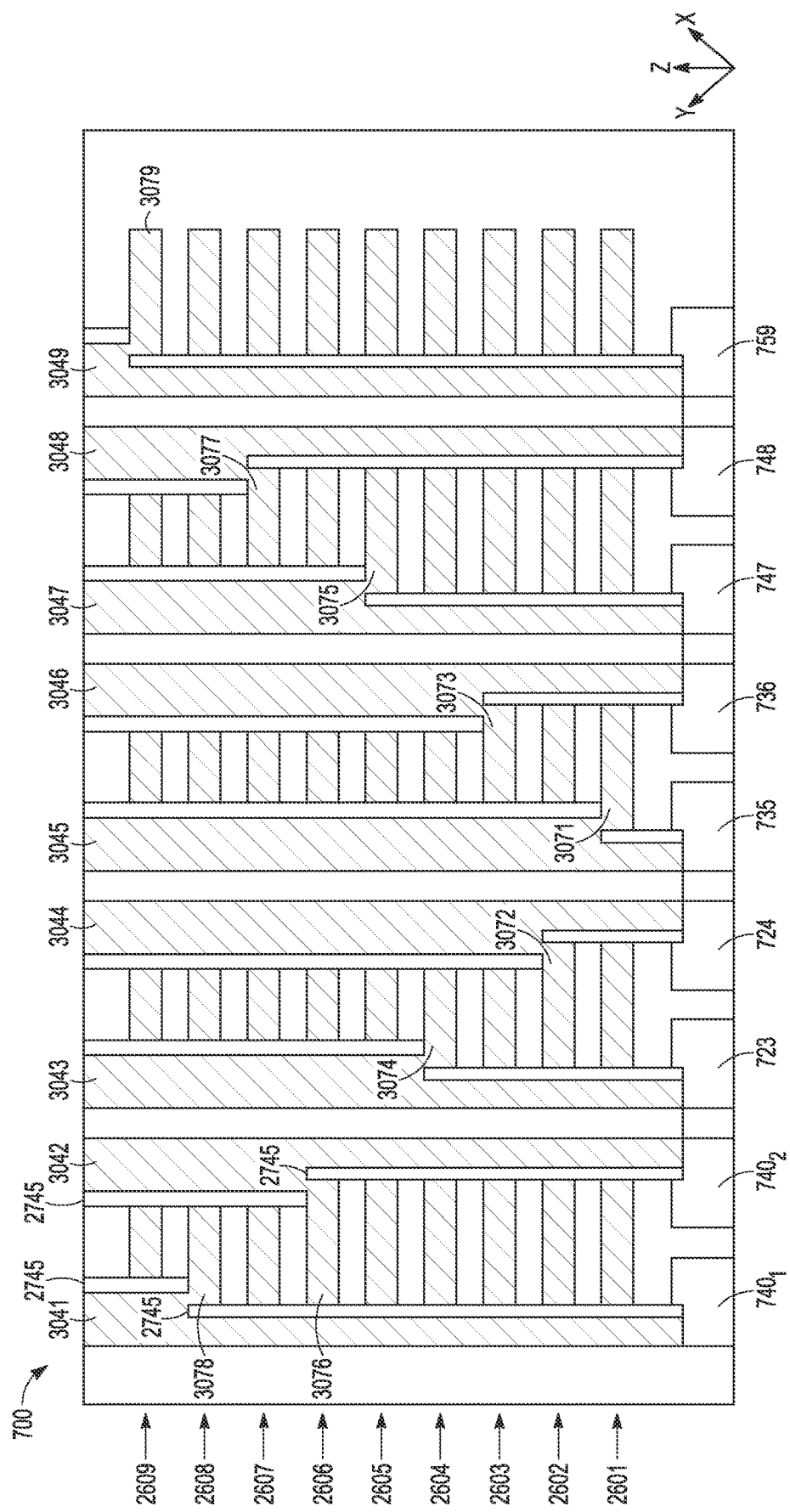

FIG. 30 shows a portion of memory device 700 after a portion (e.g., top portion of conductive material 2970 and hard masks 701 through 705 are removed. The process associated with FIG. 30 can include a material removal process (e.g., CMP process) that can remove a top portion of conductive material 2970 and the hard masks 701 through 705 and stop at the level of the material (e.g., material 2508) right below hard masks 701 through 705.

As shown in FIG. 30, the process associated with FIG. 30 can form data lines 3071 through 3079, and conductive structures 3041 through 3049. Data lines 3071 through 3079 can be located in levels 2601 through 2609, respectively, of memory device 700.

FIG. 30 shows a view of memory device 700 along line (e.g., diagonal line) 794 of FIG. 7. Thus, data lines 3071 through 3079 can be parts of five respective stacks of data lines of memory device 700 located side by side in the X-direction of FIG. 7 and on the same level of memory device 700. For example, data lines 3076 and 3078 can be two data lines of a stack of nine data lines located under (e.g., directly under) the location of hard mask 701 in FIG. 7. Data lines 3072 and 3074 can be two data lines of a stack of nine data lines located under (e.g., directly under) the location of hard mask 702 in FIG. 7. Data lines 3071 and 3073 can be two data lines of a stack of nine data lines located under (e.g., directly under) the location of hard mask 703 in FIG. 7. Data lines 3075 and 3077 can be two data lines of a stack of nine data lines located under (e.g., directly under) the location of hard mask 704 in FIG. 7. Data line 3079 can be a data line of a stack of nine data lines located under (e.g., directly under) the location of hard mask 705 in FIG. 7.

As an example, data lines 3076 and 3078 in FIG. 30 can be two data lines among the set of data lines 1701 through $170_9$ of memory device 100 of FIG. 1; data lines 3072 and 3074 in FIG. 30 can be two data lines among the set of data lines $171_1$ through $171_9$ of memory device 100 of FIG. 1; and data lines 3071 and 3073 can be two data lines of a stack of nine data lines located directly under the location of hard mask 703 in FIG. 7.

As shown in FIG. 30, the data lines in a stack of data lines can be electrically separated from each other by respective material among materials 882 through 889 that are formed in the process associated with FIG. 8. The data lines in a stack of data lines in FIG. 30 can be electrically separated from each other by a dielectric structure that includes at least one spacer among spacers 2745 (formed in the process associated with FIG. 27). For example, the stack of data lines that includes data lines 3076 and 3078 can be electrically separated from each other by a dielectric structure that includes spacers 2745 adjacent respective sides (e.g., left and right sides) of the stack of data lines that includes data lines 3076 and 3078.

The dielectric structure that electrically separate the data lines (the materials of the data lines) in a stack of data lines in FIG. 30 can also electrically separate a conductive structure from the data lines except the data line coupled to the conductive structure. For example, the dielectric structure (that includes spacers 2745 adjacent data lines 3076 and 3078) can electrically separate conductive structure 3041 from the data lines of the stack of data lines that includes data lines 3076 and 3078 except for data line 3078. In another example, the dielectric structure (that includes spacers 2745 adjacent data lines 3076 and 3078) can electrically separate conductive structure 3042 from the data lines of the stack of data lines that includes data lines 3076 and 3078 except for data line 3076.

Thus, the processes associated with FIG. 30 can form stacks of data lines (e.g., data lines 3071 through 3079) from materials 881 and conductive structures (e.g., conductive structures 3041 through 3049) of memory device 700. The conductive structures can be in electrical contact with (electrically coupled to) the stacks of data lines and respective conductive contacts (e.g., conductive contacts $740_1$, $740_2$, 723, 724, 735, 736, 747, 748, and 759) of memory device 700. The conductive structures can be located on respective sides of the each of the stacks of data lines. For example, conductive structures 3041 and 3042 can be located on respective sides (e.g., left and right sides) of the stack of data lines that includes data lines 3076 and 3078. In another, conductive structures 3043 and 3044 can be located on respective sides (e.g., left and right sides) of the stack of data lines that includes data lines 3072 and 3074.

As described above, data lines 3071 through 3079 can be parts of five stacks of data lines because FIG. 30 shows a view of memory device 700 along line (e.g., diagonal line) 794 of FIG. 7. However, one stack of data lines of memory device 700 can also have the structures of the combination of data lines 3071 through 3079. For example, the stack of nine data lines under the location of hard mask 701 (FIG. 7) can include the structures data lines 3071, 3072, 3073, 3074, 3075, 3076, 3077, 3078, and 3079 in this order where data line 3071 can be the bottom-most data line of the stack and data line 3079 can be the top-most data line of the stack.

Figure 31:
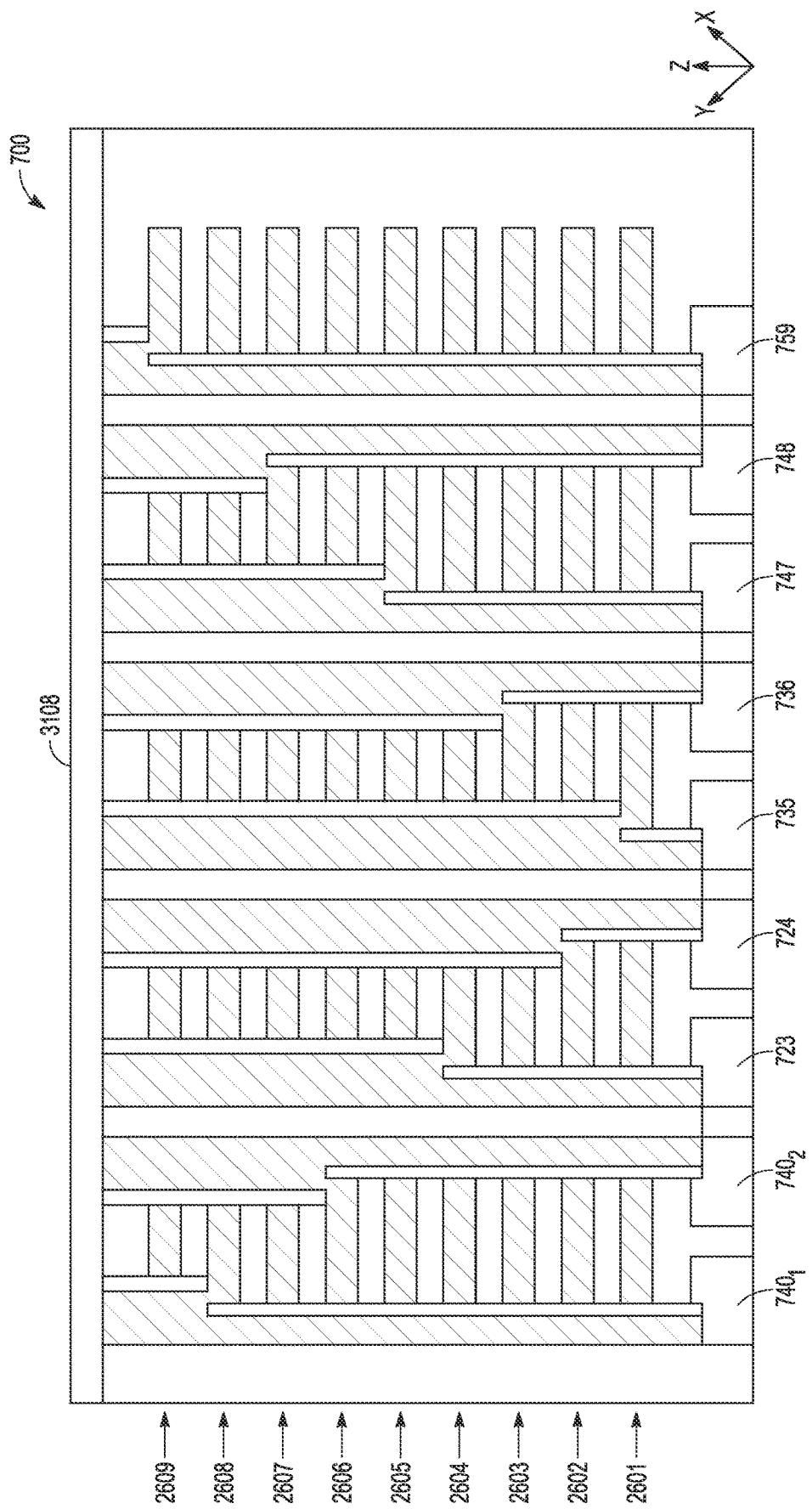

FIG. 31 shows a portion of memory device 700 after a material 3108 is formed. Material 3108 can include silicon dioxide.

The processes of forming memory device 700 can include additional processes that are omitted from the description herein. For example, additional processes can be performed to form interconnections and form conductive paths between data lines and other components of memory device 700.

The illustrations of apparatuses (e.g., memory devices 100 and 700) and methods (e.g., method of forming memory device 700) are intended to provide a general understanding of the structure of various embodiments and are not intended to provide a complete description of all the elements and features of apparatuses that might make use of the structures described herein. An apparatus herein refers to, for example, either a device (e.g., memory devices 100 and 700) or a system that include the device (e.g., memory devices 100 and 700). Although the stacked structure of data lines described herein can be included a memory device (e.g., memory devices 100 and 700). However, the stacked structure of data lines described herein can also be included in other semiconductor devices. Example of semiconductor devices include processors (e.g., general-purpose processor), application-specific integrated circuits (ASICs)), memory controllers, and other semiconductor devices.

Any of the components described above with reference to FIG. 1 through FIG. 31 can be implemented in a number of ways, including simulation via software. Thus, apparatuses (e.g., memory devices 100 and 700) or part of each of the memory devices and system described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100 and 700) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group. Audio Layer 3) players), vehicles, medical devices (e.g., heart monitor, blood pressure monitor, etc.), set top boxes, and others.

The embodiments described above with reference to FIG. 1 through FIG. 31 include apparatuses and methods of forming the apparatuses. One of the apparatus includes a first conductive contact; a second conductive contact; levels of conductive materials stacked over one another and located over the first and second conductive contacts; levels of dielectric materials interleaved with the levels of the conductive materials, the levels of conductive materials and the levels of dielectric materials formed a stack of materials; a first conductive structure located on a first side of the stack of materials and contacting the first conductive contact and a first level of conductive material of the levels of conductive materials; and a second conductive structure located on a second side of the stack of materials and contacting the second conductive contact and a second level of conductive material of the levels of conductive materials. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B. and C are listed, then the phrase "at least one of A. B and C" means A only; B only; C only; A and B (excluding C); A and C (excluding B); B and C (excluding A); or all of A. B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B. and C are listed, then the phrase "one of A. B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a first conductive contact;
a second conductive contact;
levels of conductive materials stacked over one another and located over the first and second conductive contacts, wherein the levels of conductive materials are part of data lines for memory cell strings of the apparatus;
levels of dielectric materials interleaved with the levels of the conductive materials, the levels of conductive materials and the levels of dielectric materials forming a stack of materials;
a first conductive structure located on a first side of the stack of materials and contacting the first conductive contact and a first level of conductive material of the levels of conductive materials; and
a second conductive structure located on a second side of the stack of materials and contacting the second conductive contact and a second level of conductive material of the levels of conductive materials.

2. The apparatus of claim 1, further comprising:
a first conductive pillar located under the first conductive contact and contacting the first conductive contact, wherein the first conductive pillar is included in a first memory cell string of the memory cell strings; and
a second conductive pillar located under the second conductive contact and contacting the second conductive contact, wherein the second conductive pillar is included in a second memory cell string of the memory cell strings.

3. The apparatus of claim 1, wherein one conductive material of the levels of conductive materials is between the first level of conductive material and the second level of conductive materials.

4. The apparatus of claim 1, wherein:
the first level of conductive material includes a first protrusion portion;
the second level of conductive material includes a second protrusion portion;
the first conductive structure contacts the first level of conductive material at the first protrusion portion; and
the second conductive structure contacts the second level of conductive material at the second protrusion portion.

5. An apparatus comprising:
a first conductive contact;
a second conductive contact;
levels of conductive materials stacked over one another and located over the first and second conductive contacts;
levels of dielectric materials interleaved with the levels of the conductive materials, the levels of conductive materials and the levels of dielectric materials forming a stack of materials;
a first conductive structure located on a first side of the stack of materials and contacting the first conductive contact and a first level of conductive material of the levels of conductive materials;
a second conductive structure located on a second side of the stack of materials and contacting the second conductive contact and a second level of conductive material of the levels of conductive materials,
the first level of conductive material includes a first protrusion portion;
the second level of conductive material includes a second protrusion portion;
the first conductive structure contacts the first level of conductive material at the first protrusion portion; and
the second conductive structure contacts the second level of conductive material at the second protrusion portion; and
a dielectric structure separating the first conductive structure from the levels of conductive materials except the first level of conductive material.

6. The apparatus of claim 5, further comprising an additional dielectric structure separating the second conductive structure from the levels of conductive materials except the second level of conductive material.

7. An apparatus comprising:
memory cell strings;
data lines located over the memory cell strings, the data lines stacked over one another in different levels of the apparatus forming a stack of data lines;
conductive lines coupled to the memory cell strings and the data lines, such that each of the conductive lines is coupled to a respective data line of the data lines and a respective memory cell string of the memory cell strings, wherein the conductive lines include a first conductive structure located on a first side of the stack of data lines and coupled to a first data line of the data lines and a first memory cell string of the memory cell strings, and a second conductive structure located on a second side of the stack of data lines and coupled to a second data line of the data lines and a second memory cell string of the memory cell strings;
select transistors, each of the select transistors coupled between memory cells of a respective memory cell string of the memory cell strings and a respective conductive line of the conductive lines;
a select gate shared by the select transistors; and
access lines shared by the memory cell strings.

8. The apparatus of claim 7, further comprising:
additional memory cell strings;
additional conductive lines coupled to the additional memory cell strings and the data lines, such that each of the additional conductive lines is coupled to a respective data line of the data lines and a respective memory cell string of the additional memory cell strings; and
additional access lines shared by the additional memory cell strings and electrically separated from the access lines.

9. The apparatus of claim 7, further comprising:
additional memory cell strings;
additional data lines located over the additional memory cell strings, the additional data lines stacked over one another in different levels of the apparatus; and
additional conductive lines coupled to the additional memory cell strings and the additional data lines, such that each the additional conductive lines is coupled to a respective data line of the additional data lines and a respective memory cell string of the additional memory cell strings, wherein the access lines are shared by the memory cell strings and the additional memory cell strings.

10. The apparatus of claim 9, wherein the data lines are included in a first stack of data lines and the additional data lines are included in a second stack of data lines, and the first and second stacks of data lines are located side by side with each other on a same level of the apparatus.

* * * * *